(12) United States Patent
Ghezzi et al.

(10) Patent No.: US 9,651,580 B2
(45) Date of Patent: May 16, 2017

(54) ELECTRONIC DEVICE FOR MEASURING A DIFFERENTIAL CURRENT IN AN ELECTRIC LINE

(71) Applicant: ABB S.p.A., Milan (IT)

(72) Inventors: Luca Ghezzi, Gallarate (IT); Fabio Vallarino, Magenta (IT); Paolo Antonello, Arluno (IT)

(73) Assignee: ABB S.P.A., Milan (IT)

( * ) Notice: Subject to any disclaimer, the term of this patent is extended or adjusted under 35 U.S.C. 154(b) by 24 days.

(21) Appl. No.: 14/947,355

(22) Filed: Nov. 20, 2015

(65) Prior Publication Data
US 2016/0154028 A1    Jun. 2, 2016

(30) Foreign Application Priority Data

Nov. 27, 2014   (EP) .................................... 14195071

(51) Int. Cl.
*G01R 15/18*       (2006.01)
*H01H 83/22*       (2006.01)

(52) U.S. Cl.
CPC ......... *G01R 15/183* (2013.01); *H01H 83/226* (2013.01)

(58) Field of Classification Search
CPC .......... G01R 1/20; G01R 1/22; G01R 23/165; G01R 23/167; G01R 33/3621;
(Continued)

(56) References Cited

U.S. PATENT DOCUMENTS 4,709,339 A * 11/1987 Fernandes .............. G01K 1/024
                                                    324/127
5,576,921 A    11/1996 Brunner
(Continued)

FOREIGN PATENT DOCUMENTS

EP    2509092 A1    10/2012
EP    2747229 A1    6/2014

OTHER PUBLICATIONS

Extended European Search Report issued Jun. 5, 2015 in EP Appln No. 14195071.7.

*Primary Examiner* — Tung X Nguyen
(74) *Attorney, Agent, or Firm* — Polsinelli PC

(57) ABSTRACT

An electronic device (1) for measuring a differential current (ID) in an electric line (100) having a plurality of conductors, said electronic device comprising: a sensing circuit (2) comprising: a current transformer (21) having a magnetic core (211) through which the conductors of said electric line pass, a secondary winding (212) and an excitation winding (213) along which an excitation current (IE) circulates to polarize said magnetic core (211); an output circuit section (22) electrically connected to said secondary winding (212) and configured to provide a first signal (V1). The electronic device (1) further comprises: a first signal processing block (3) configured to process said first signal (V1) and provide a second signal (VD) indicative of said differential current (ID); a second signal processing block (4) configured to process said second signal (VD) and provide a first measurement signal (IDCM) indicative of the absolute value of a time-invariant component of said differential current (ID); a third signal processing block (5) configured to process said first signal (V1) and provide third and fourth signals (S1, S2) indicating whether said magnetic core (211) operates in a positive and/or in a negative saturation region of the hysteresis loop of said magnetic core; a fourth signal processing block (6) configured to process said third and fourth signals (S1, S2) and provide a second measurement signal (SDC) indicative of the direction of the time-invariant component of said differential current (ID).

20 Claims, 20 Drawing Sheets

Figure 1A:
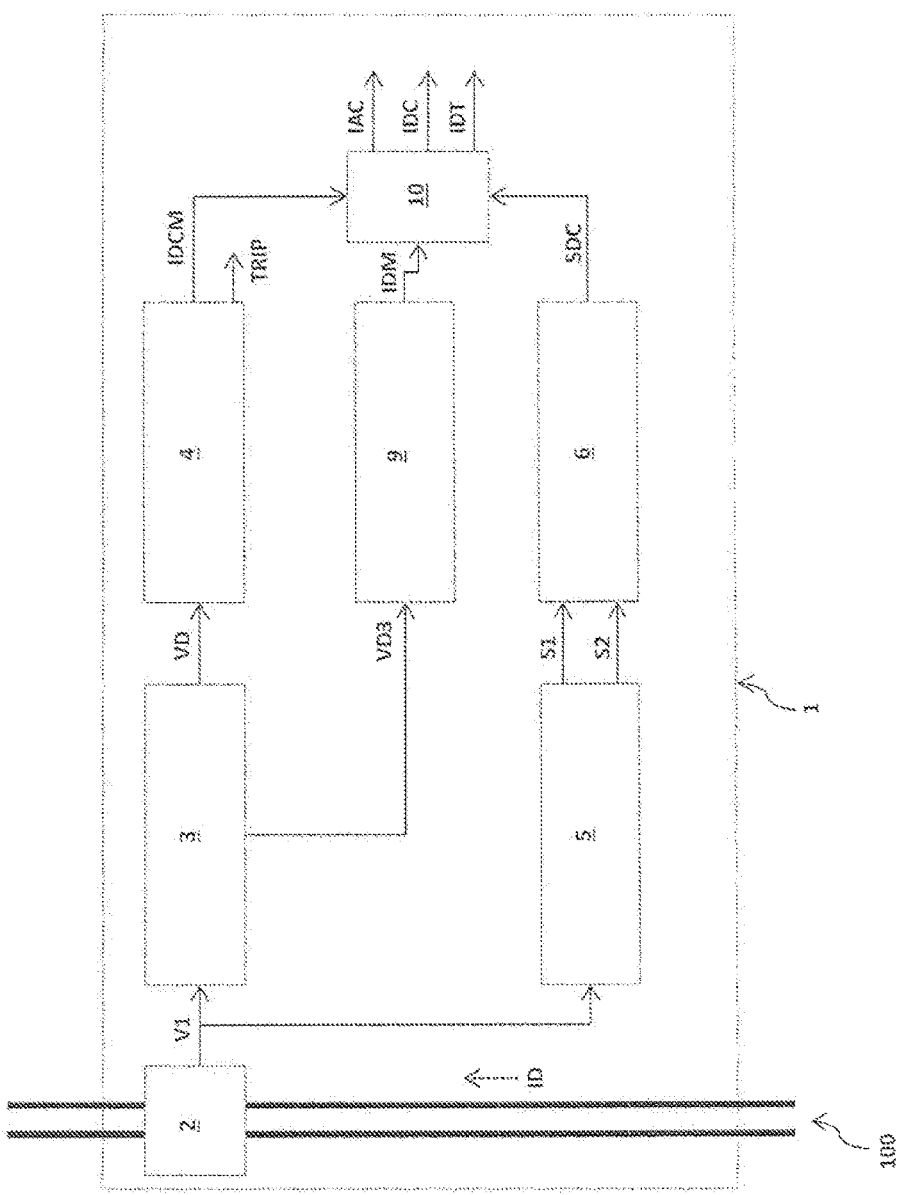

(58) Field of Classification Search
CPC .. G01R 1/203; G01R 15/146; G01R 19/0007; G01R 31/26; G01R 31/2642; G01R 31/2648; G01R 31/2831; G01R 31/31702
See application file for complete search history.

(56) References Cited

U.S. PATENT DOCUMENTS

| | | | |
|---|---|---|---|
| 6,590,380 B2 * | 7/2003 | Edel | G01R 15/183 323/357 |
| 2006/0290454 A1 | 12/2006 | Mas et al. | |
| 2013/0328548 A1 * | 12/2013 | Hackl | G01R 1/22 324/127 |

* cited by examiner

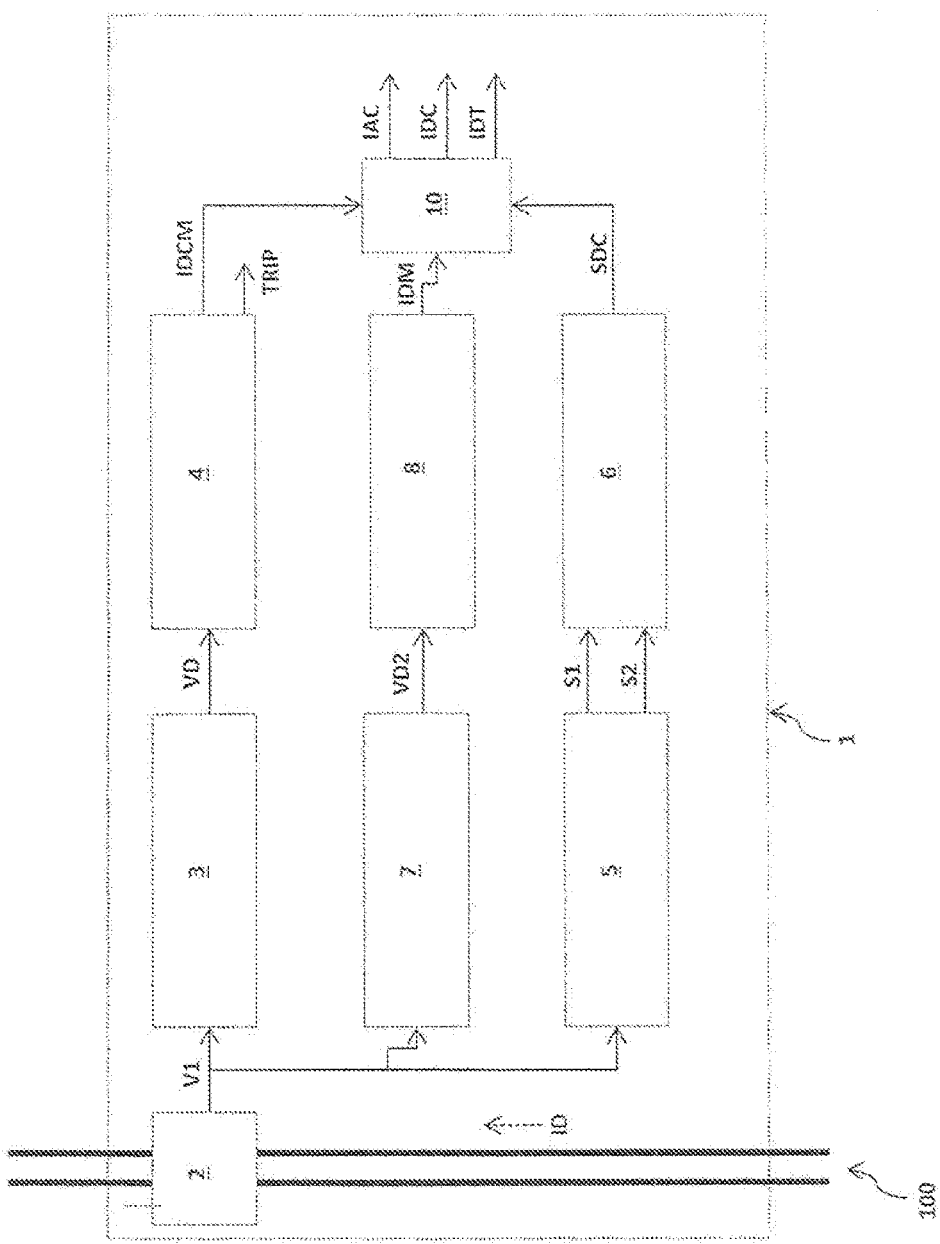

ELECTRONIC DEVICE FOR MEASURING A DIFFERENTIAL CURRENT IN AN ELECTRIC LINE

CROSS REFERENCE TO RELATED APPLICATIONS

This application is claims priority to Application No. 14195071.7 filed in Europe on Nov. 27, 2014 under 35 U.S.C. §119. The entire contents of this application are hereby incorporated by reference.

The present invention relates to an electronic device for measuring a differential current in an electric line.

The electronic device of the invention is particularly suitable for low or medium voltage applications, where the term "low voltage" (LV) relates to voltages lower than 1 kV AC and 1.5 kV DC and the term "medium voltage" (MV) relates to voltages higher than 1 kV AC and 1.5 kV DC up to some tens of kV, e.g. up to 72 kV AC and 100 kV DC. As is known, in many LV or MV electric systems, e.g. in electric power distribution networks or photovoltaic electric power generation systems or battery charging systems for electric vehicles, it is necessary to detect possible differential currents among the conductors of an electric line.

The presence of differential currents may, in fact, be indicative of occurring fault conditions. In the state of the art, many examples of protection devices are known, which are capable to detect the presence of AC or DC differential currents in an electric line.

Many currently available solutions provide only qualitative information about a detected differential current. In practice, these devices are merely capable to indicate whether a detected differential current overcomes a given threshold value indicative of the presence of a fault condition.

Other solutions are known, which are capable to provide also quantitative information about a detected differential current. Unfortunately, currently available devices of this type are often relatively complicated and expensive to manufacture at industrial level. In addition, they sometimes show poor performances in terms of a flexibility of use.

The main aim of the present invention is to provide an electronic device for measuring a differential current in an electric line, which allows overcoming limitations of current solutions of the state of the art.

Within this aim, an object of the present invention is to provide an electronic device that is capable of detecting a differential current in an electric line and providing quantitative information (measuring signals) about the detected differential current.

A further object of the present invention is to provide an electronic device that offers outstanding performances in terms of flexibility of use.

Yet another object of the present invention is to provide an electronic device that is relatively easy and cheap to manufacture at industrial level.

The present invention thus provides an electronic device for measuring a differential current in an electric line, according to the following claim 1 and the related dependent claims.

The electronic device, according to the invention, is capable of detecting and measuring a time-invariant component of a differential current among the conductors of an electric line, such as, for example, a leakage current caused by the deterioration of an electric insulation arrangement or by the failure of components connected to ground.

In particular, the electronic device, according to the invention, is capable of providing information indicative of the absolute value and the flowing direction of a time-invariant component of a differential current among the conductors of an electric line.

The electronic device, according to the invention, is also capable of detecting and measuring a time-variant component of a differential current among the conductors of an electric line, such as, for example, a ground fault current.

For the sake of clarity, the terms "time-invariant component" and "time-variant component" of a differential current respectively mean a DC component and an AC component of said differential current.

As is widely known, a differential current in an electric line may include only a DC current or only AC current or, more frequently, is the result of the superimposition of AC and DC currents.

Currents varying much slowly with respect to the variation rates (e.g. 50 Hz) commonly used in LV or MV electrical systems are here considered as DC currents.

Currents not having a sine wave-form but showing periodic variations (e.g. pulsed currents, partialized currents or the like) are here considered as AC currents.

The electronic device, according to the invention, is capable of detecting a differential current in an electric line, decomposing the detected differential current in its DC and AC components and providing measuring signals indicative of each of said components.

The quantitative information about the time-invariant and time-variant components of a differential current in an electric line may be conveniently exploited in many kinds of LV and MV applications.

As an example, in a battery charging system for vehicles, information collected by measuring the time-invariant component of a detected differential current may be used to compensate small intrinsic DC earth leakages occurring during normal operating conditions or to ensure a correct operation of protection devices positioned upstream with respect to the point of the installation at which said DC earth leakages occur.

As a further example, in LV or MV electric power distribution networks, measurement information about the time-invariant and time variant components of a differential current may be used to practically implement advanced protection or fault-management strategies.

Further aspects of the invention relate to an electronic arrangement for LV or MV applications, according to the following claims 13 and 14.

A further aspect of the invention relates to a photovoltaic electric power generation system, according to the following claim 15.

A further aspect of the invention relates to a LV or MV electric power distribution system or network, according to the following claim 16.

Figure 1B:
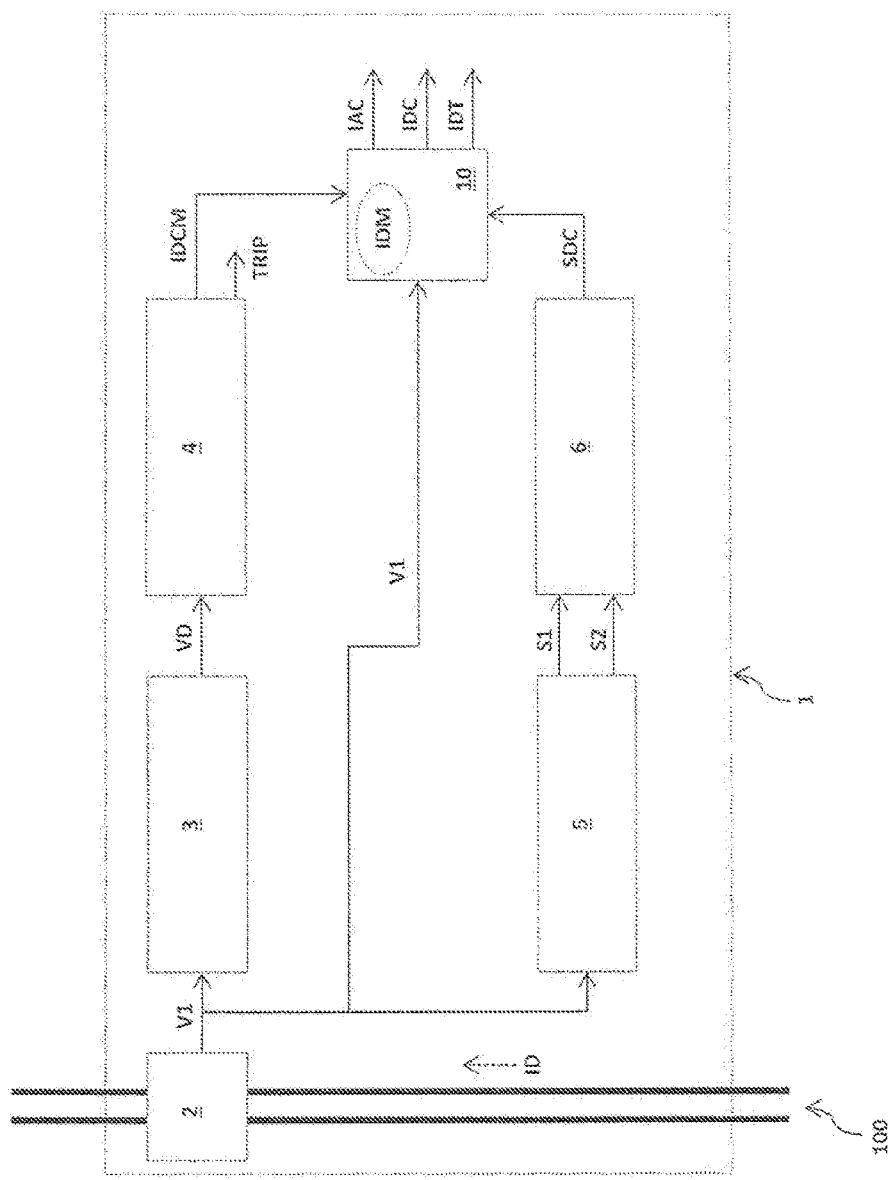
Figure 16:
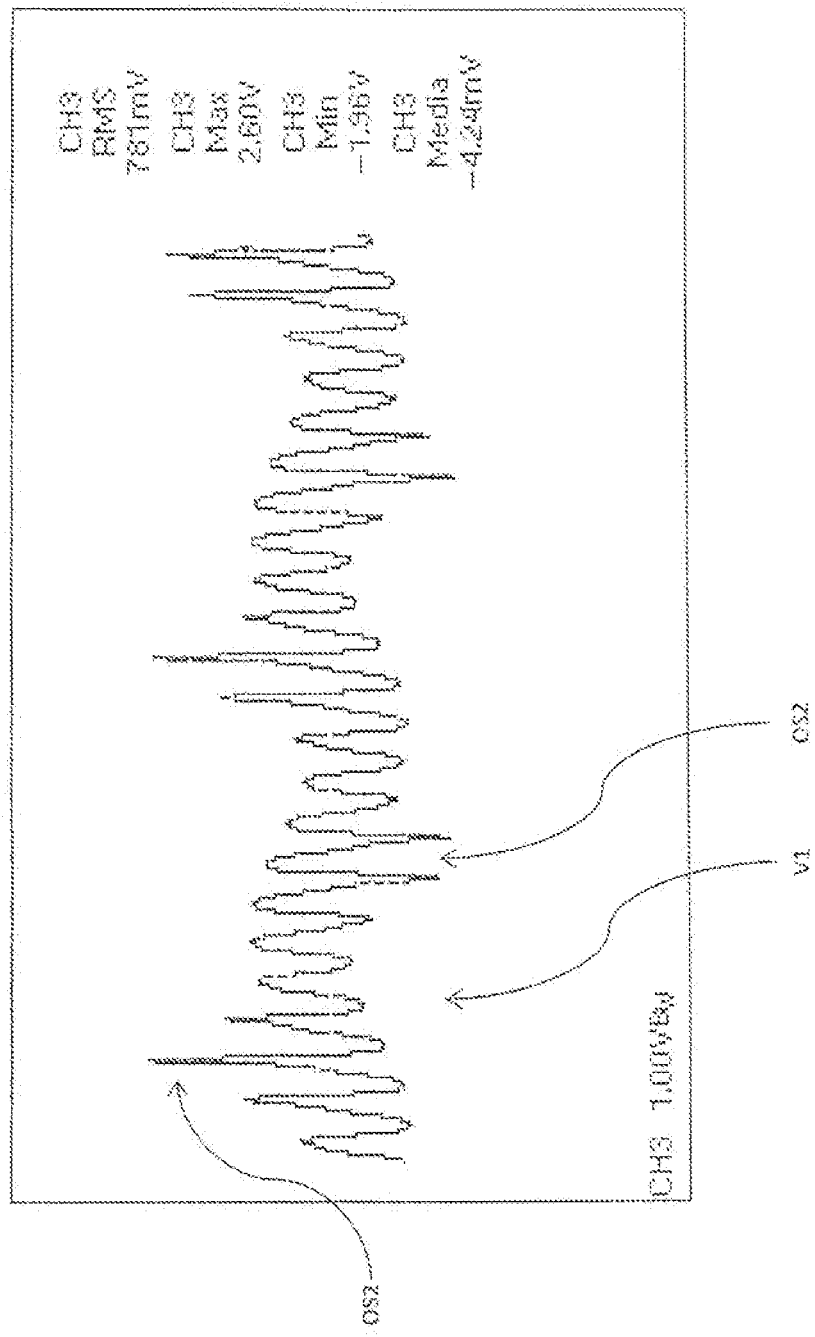
Figure 17:
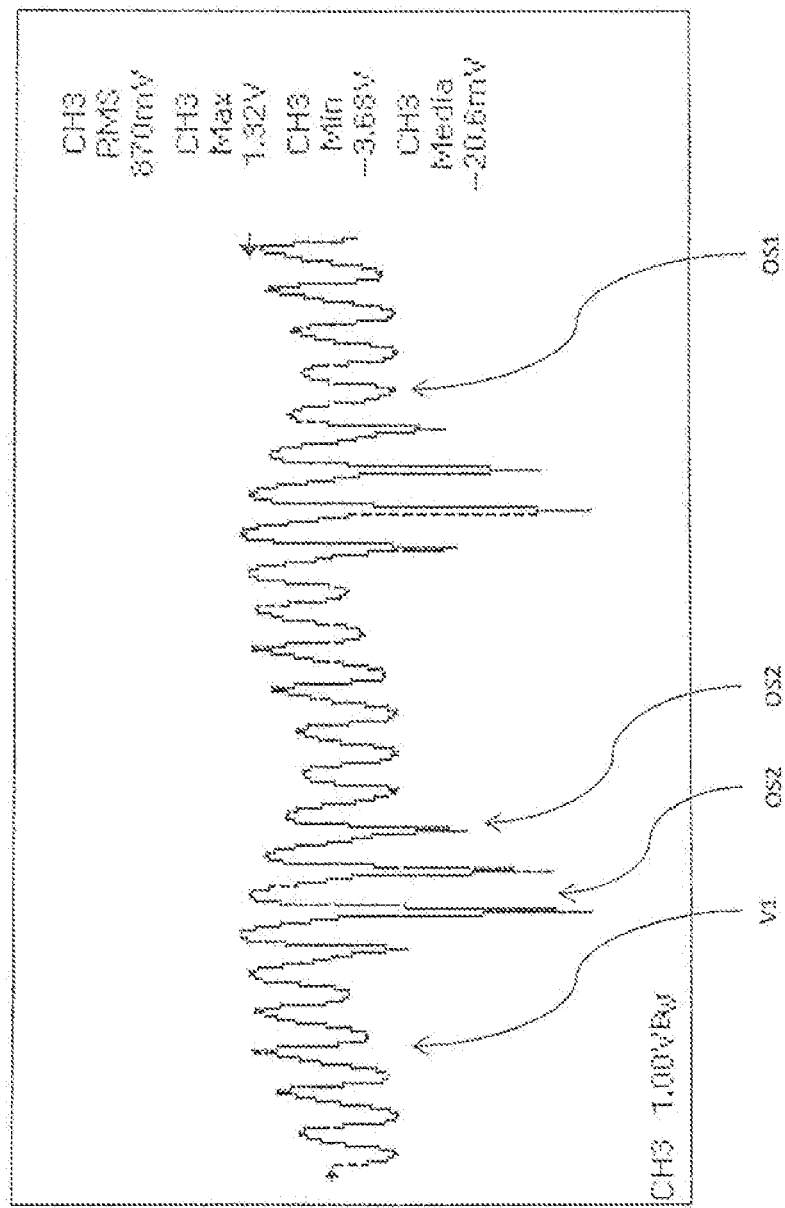
Figure 18:
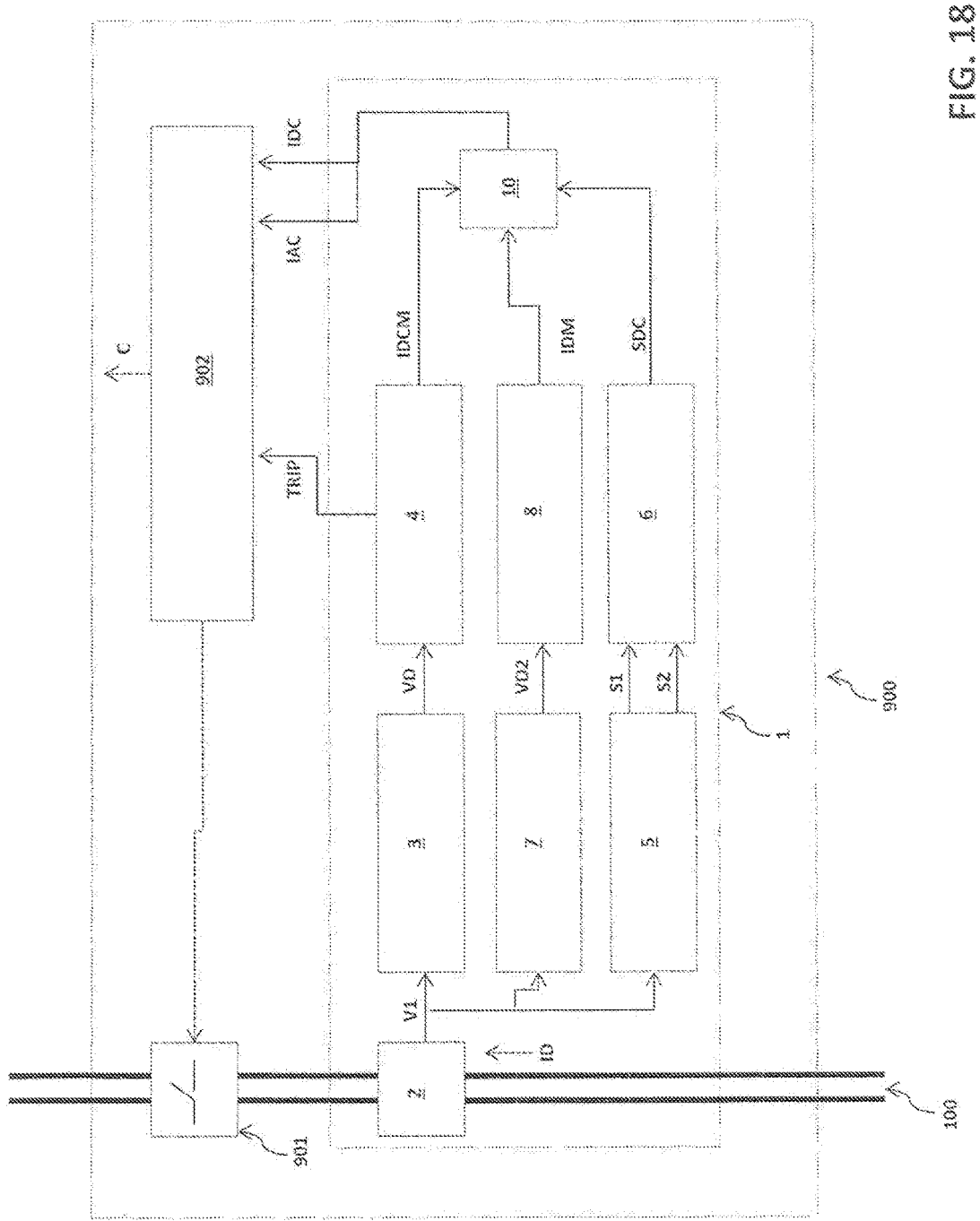

Further characteristics and advantages of the invention will emerge from the description of preferred, but not exclusive, embodiments of the power and control unit for a low or medium voltage apparatus, according to the invention, non-limiting examples of which are provided in the attached drawings, wherein:

FIG. 1 schematically shows an embodiment the electronic device, according to the invention; and FIG. 1A schematically shows a further embodiment the electronic device, according to the invention; and FIG. 1B schematically shows a further embodiment the electronic device, according to the invention; and FIGS. 2-13 schematically show different kinds of signal processing blocks included in the electronic device, according to the invention; and FIGS. 14-17 schematically show some possible waveforms of a signal in the electronic device, according to the invention; and FIG. 18 schematically shows an electronic arrangement for LV or MV applications, which comprises the electronic device, according to the invention.

Referring to the cited figures, the present invention relates to an electronic device 1 for measuring a differential current ID in a LV or MV electric line 100.

The electric line 100 may be, for example, an electric power supply line of an electric power distribution network or a battery charging system for electric vehicles.

The electric line 100 comprises a plurality of conductors and it may be, for example, of the single or multi-phase type.

The electronic device 1 comprises a sensing circuit 2 operatively coupled to the conductors of the electric line 100.

Figure 2:
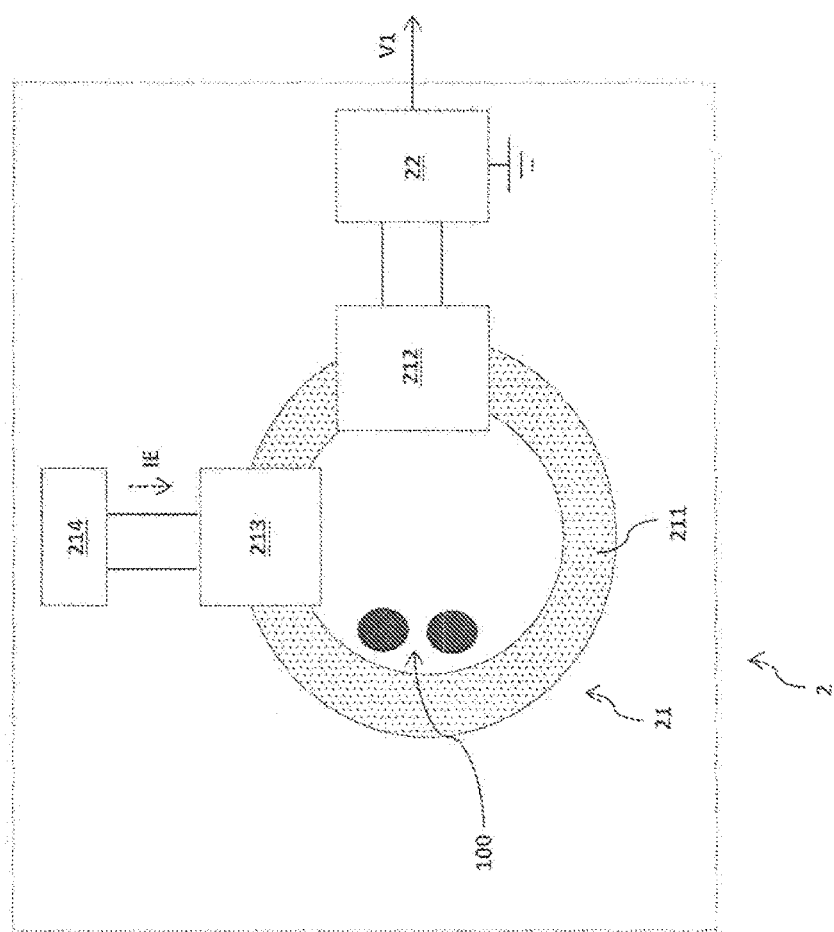

Referring to FIG. 2, the sensing circuit 2 advantageously comprises a current transformer 21 provided with a magnetic core 211, preferably shaped as a toroid.

Advantageously, the magnetic core 211 has a high magnetic permeability and it may be made, for example, of a Ni—Fe alloy.

The transformer 21 is advantageously arranged to sense unbalancing currents among the conductors of the electric line 100.

The conductors of the electric line 100 pass through the magnetic core 211 so as to form the primary winding for the transformer 21.

In order to increase the overall sensitivity to possible differential currents in the electric line 100, the conductors of the primary line 100 may be wound around the magnetic core 211 to form multiple turns, for example 3 turns.

The transformer 21 has a secondary winding 212 that is advantageously wound around the magnetic core 211 with a relatively high number of turns, for example 250 turns.

The transformer 21 further comprises an excitation winding 213, which is advantageously wound around the magnetic core 211 with a relatively high number of turns, for example 250 turns.

During the operation of the electronic device 1, an AC excitation current IE circulates along the excitation winding 213.

The excitation current IE may be advantageously generated by a generation circuit 214 that may be of the known type, for example an electronic oscillator circuit.

As an example, the excitation current IE may have a frequency of 500 Hz and a waveform that may be, for example, sinusoidal.

As it occurs in other known LV-MV applications, for example in a traditional ELCD (Earth Leakage Current Device) of the B-type, the excitation current IE polarizes the magnetic core 211 of the transformer 21 at an operating point in which the magnetic permeability of the magnetic core 211 shows a strong transition towards small values, namely at an operating point located in proximity of a positive or negative saturation region of the hysteresis loop of the magnetic core 211.

The sensing circuit 2 comprises an output circuit section 22 electrically connected to the secondary winding 212 of the transformer 21.

The output circuit section 22 is configured to provide a first signal V1 (preferably a voltage signal) indicative of the differential current ID. Basically, it receives a current circulating along the secondary winding 212 and generates the signal V1.

The output circuit section 22 may advantageously comprise a resistive circuit (e.g. a shunt-resistor connected between a terminal of the secondary winding and ground) to generate the signal V1.

FIGS. 14-17 show some experimental measurements of the signal V1 in different operative conditions.

Figure 14:
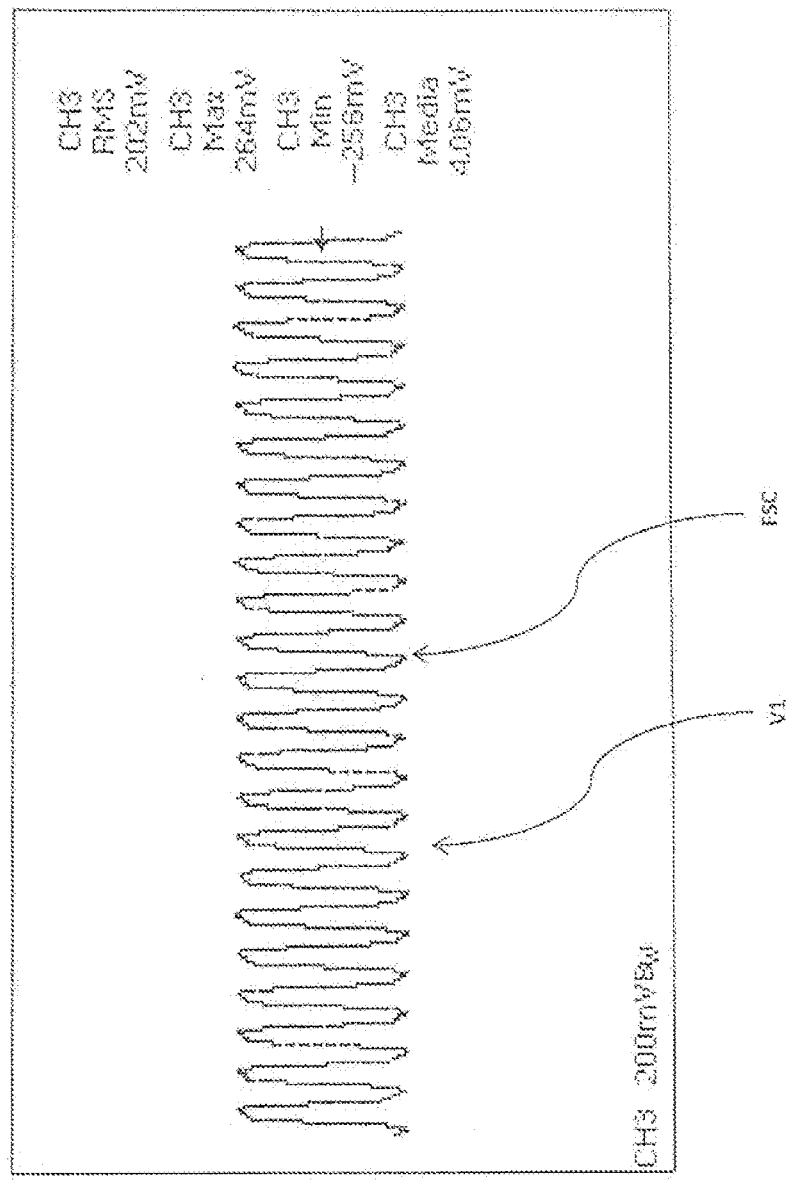

The signal V1 is basically an AC signal comprising a fixed AC signal component FSC due to circulation of the excitation current IE along the excitation winding 213 (FIG. 14).

When no differential current ID is present among the conductors of the electric line 100, the signal V1 basically depends on the waveform and carrier frequency of the excitation current IE only (FIG. 14).

Figure 15:
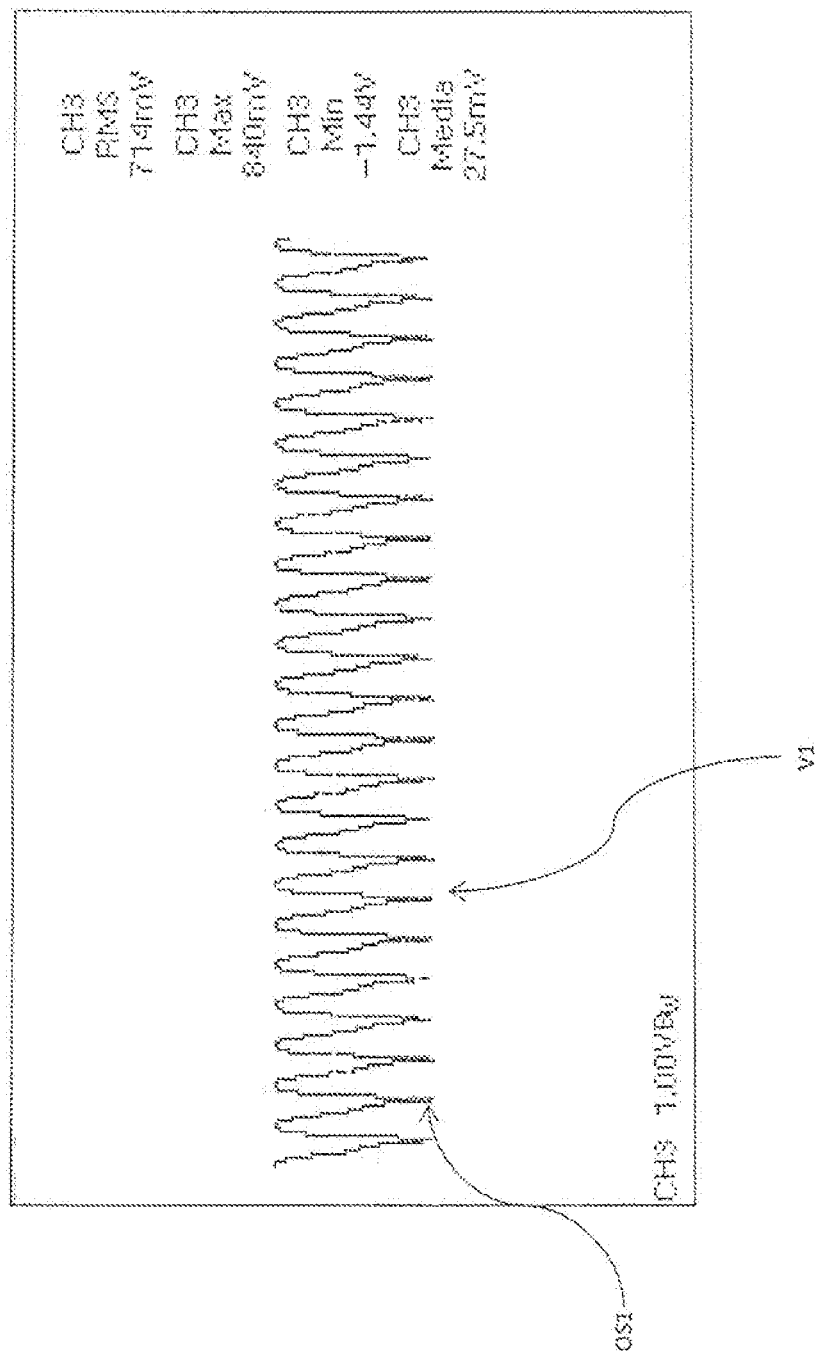

When it is present a differential current ID having only a time-invariant component, the signal V1 has the same frequency of the excitation current IE but it may show first amplitude over-shoots OS1 occurring with multiple frequencies of the excitation current IE (FIG. 15). The amplitude over-shoots OS1 may be positive or negative depending on the direction of the current ID.

When it is present a differential current ID having only a time-variant component, the signal V1 has the same carrier frequency of the excitation current IE but it may show a waveform modulated in amplitude and second amplitude over-shoots OS2 occurring with frequencies different from the frequency of the excitation current IE (FIG. 16). The amplitude over-shoots OS2 may be positive and/or negative.

When it is present a differential current ID having both time-invariant and time-variant components, the voltage V1 has the same carrier frequency of the excitation current IE but it may show a waveform possibly modulated in amplitude and having amplitude overshoots induced by the non-linear, saturating behaviour of the magnetic material of the magnetic core 211. For example, as shown in FIG. 17, the waveform may have the first and second amplitude over-shoots OS1, OS2 described above. The waveform may have higher and lower amplitude over-shoots OS2 (positive and/or negative) occurring with frequencies different from the frequency of the excitation current IE.

Referring now to FIGS. 1, 1A, 1B, according to the invention, the electronic device 1 comprises a first signal processing block 3 configured to process the signal V1. The signal processing block 3 provides a second signal VD (preferably a voltage signal) indicative of a differential current ID detected by the sensing circuit 2.

When no differential current ID is present among the conductors of the electric line 100, the signal VD has amplitude substantially null (e.g. 0.4V).

When a differential current ID is present, the signal VD is substantially a function of the time-invariant and time-variant components of the differential current ID.

Preferably, the signal processing block 3 is configured to provide a signal VD that is more sensitive to the time-invariant component of the differential current ID.

The electronic device 1 comprises a second signal processing block 4 configured to process the second signal VD.

The second signal processing block 4 provides a first measurement signal IDCM indicative of the absolute value of a time-invariant component of a differential current ID detected by the sensing circuit 2.

The signal processing block 4 calculates the measurement signal IDCM substantially according to the mathematical relation IDCM=f(VD)+Err, where Err is a measurement error (due to the time-variant component of the differential current ID along with other possible, minor, affecting factors not relevant to the invention).

On the field measurements have shown that the measurement error Err is relatively small for most of the applications in which the electronic device 1 may be adopted. The measurement error Err can thus be neglected without prejudice for the overall reliability of the electronic device 1.

The electronic device 1 comprises a third signal processing block 5 configured to process the signal V1.

The signal processing block 5 provides third and fourth signals S1, S2 (preferably voltage signals) that indicate whether the magnetic core 211 of the transformer 21 operates in a positive or in a negative saturation region of its own hysteresis loop, when the differential current ID has a time-invariant current component that is not null.

The signal processing block 5 is advantageously configured to provide information on the non-linear effect produced on the magnetic core 211 by said time-invariant component.

In the magnetic core 211, a magnetic field is present due to the superimposition of a magnetic field generated by the excitation current IE and a magnetic field generated by the differential current ID.

Such a magnetic field may be prevalently positive or negative depending on whether the time-invariant component of the differential current ID is respectively positive or negative (according to a given sign convention).

Signals S1, S2 are indicative of such a non-linear behaviour of the magnetic core 211 and thus can be used to obtain information on the flowing direction (i.e. the sign) of the time-invariant component of a differential current ID among the conductors of the electric line 100.

The electronic device 1 comprises a fourth signal processing block 6 configured to process the third and fourth signals S1, S2.

The signal processing block 6 provides a second measurement signal SDC indicative of the direction of the time-invariant component of a differential current ID detected by the sensing circuit 2.

As illustrated above, a prevalently positive or negative magnetic field may be present in the magnetic core 211 of the transformer 21, when a differential current ID is present among the conductors of the electric line 100.

The non-linear effect produced on the magnetic core 211 by the time-invariant component of the differential current ID may be high, moderate or low.

Figure 11:
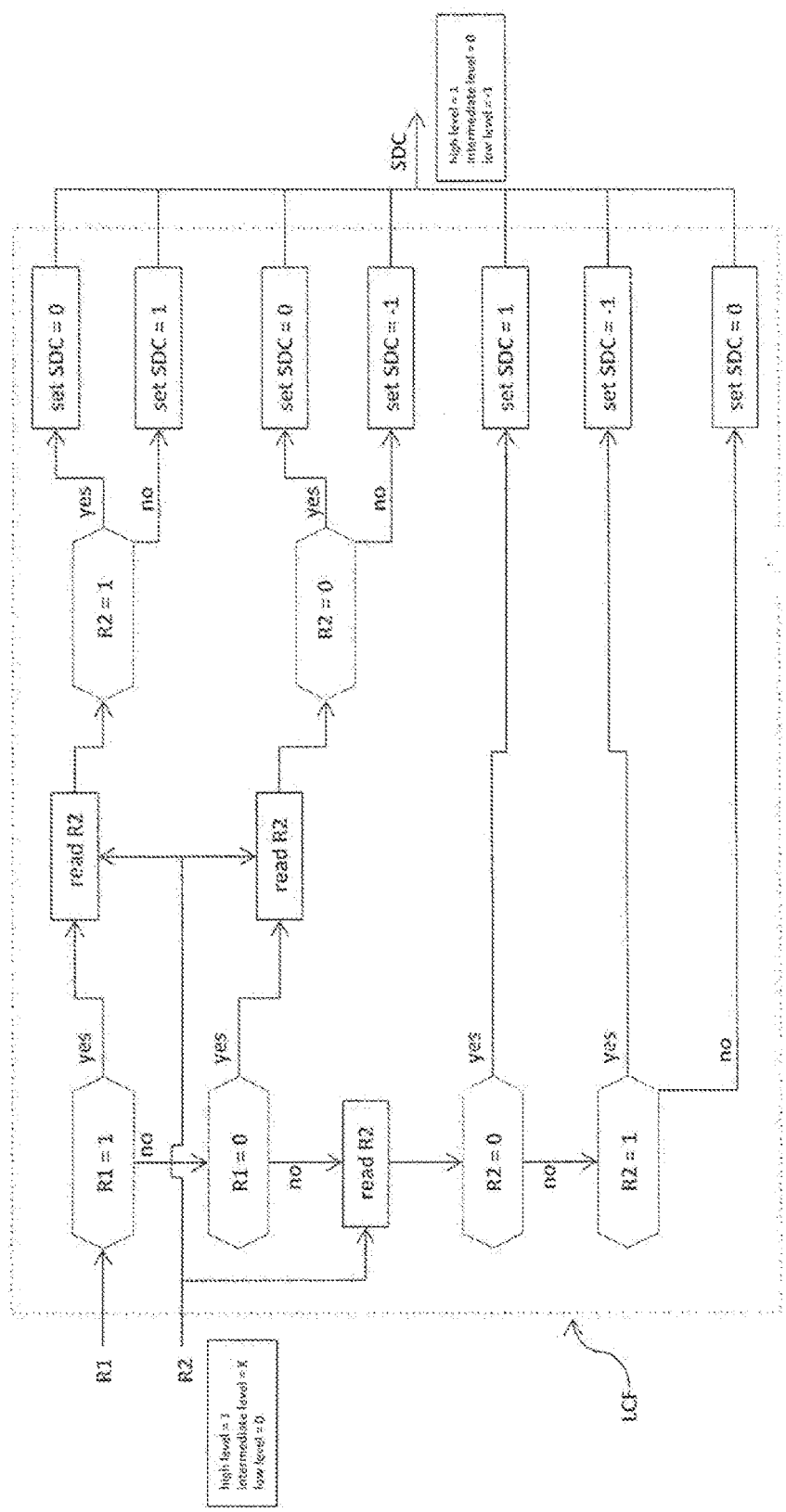
Figure 12:
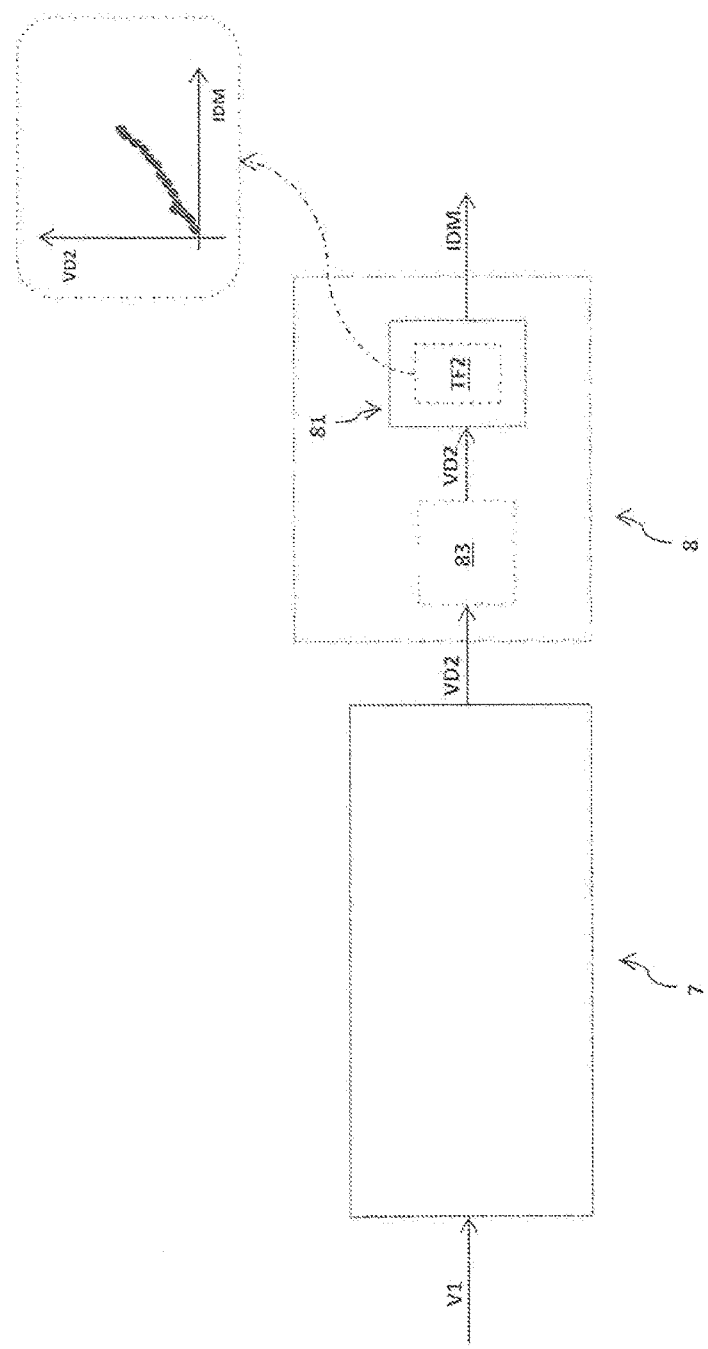

The signal processing block 6 processes the signals S1, S2 to provide information R1, R2 indicating whether the intensity of the signals S1, S2 is at a high, moderate or low level (FIGS. 11-12).

Then, the signal processing block 6 processes such information R1, R2 to determine the sign of the time-invariant component of the differential current ID.

As it will be explained in more details in the following, in some cases the sign of the time-invariant component of the differential current ID cannot be determined because the non-linear effect produced on the magnetic core 211 is null or too moderate.

According to an aspect of the invention, the electronic device 1 may comprise a fifth signal processing block 10 configured to process the measurement signals IDCM and SDC and provide a fourth measurement signal IDC indicative of the time-invariant component (with its sign) of a detected differential current ID.

The quantitative information IDC may be calculated on the base of measurement data IDCM, SDC. To this aim, the signal processing block 10 may be configured to calculate the data IDC on the base of the following mathematical relation: IDC=SDC*IDCM.

According to an aspect of the invention, the electronic device 1 is also capable of providing quantitative information IAC about the time-variant component of a detected differential current ID.

In a possible embodiment of the invention (FIGS. 1, 18), the electronic device 1 comprises a sixth signal processing block 7 configured to process the first signal V1 and provide a fifth signal VD2 (preferably a voltage signal) indicative of the differential current ID.

When a differential current ID is present, the signal VD2 is substantially a function of the time-invariant and time-variant components of the differential current ID.

Preferably, the signal processing block 7 is configured so that they provide a signal VD2 that is more sensitive to the time-variant component of the differential current ID.

The electronic device 1 comprises a seventh signal processing block 8 configured to process the fifth signal VD2 and provide a third measurement signal IDM indicative of the absolute value of the differential current ID.

In an alternative embodiment of the invention (FIG. 1A), the signal processing block 3 is advantageously configured to provide a sixth signal VD3 (preferably a voltage signal) indicative of the differential current ID.

In some embodiments, the sixth signal VD3 may coincide with the second signal VD.

The electronic device 1 comprises an eighth signal processing block 9 configured to process the signal VD3 and provide the third measurement signal IDM.

Preferably, the fifth signal processing block 10 is also configured to process the measurement signals IDCM, IDM and provide a fifth measurement signal IAC indicative of the time-variant component of the differential current ID.

The quantitative information IAC may be complementary calculated on the base of measurement data IDCM, IDM.

According to an aspect of the invention, the electronic device 1 is also capable of providing quantitative information IDT about a detected differential current ID.

In this case, the signal processing block 10 are also configured to process the measurement signals IDCM, SDC, IDM and provide a sixth measurement signal IDT indicative of the overall differential current ID present between the conductors of the electric line 100.

Other solutions for additionally providing the measurement signals IAC and/or IDT are possible.

For example, in a further embodiment of the invention (FIG. 1B), which is particularly suitable for a digital implementation, the signal processing block 10 may be configured to process the measurement signals IDCM, SDC and the signal V1 in order to provide the measurement signal IAC and/or the measurement signal IDT.

The signal processing blocks 3, 4, 5, 6, 7, 8, 9, 10 may be industrially implemented in an analog and/or digital manner.

If they are implemented in analog manner, they comprise electronic circuits suitably arranged to perform the functions of said signal processing blocks. Said electronic circuits may form separated circuit units or may be at least partially integrated in one or more circuit units.

If they are implemented in a digital manner, they comprise suitably arranged software instructions stored in a medium and executable by one or more computerised units (e.g. microprocessors) to perform the functions of said signal processing blocks.

The present invention will be now described in more details with reference to embodiments, in which the signal processing blocks 3, 5, 7 are implemented in an analog manner and the signal processing blocks 4, 6, 8, 9, 10 are implemented in a digital manner.

This choice is not intended to limit the scope of the invention in any way.

Other embodiments, in which one or more of the signal processing blocks 3, 5, 7 are implemented in a digital manner and in which one or more of the signal processing blocks 4, 6, 8, 9, 10 are implemented in an analog manner, are possible and fall within the scope of the present invention.

Figure 3:
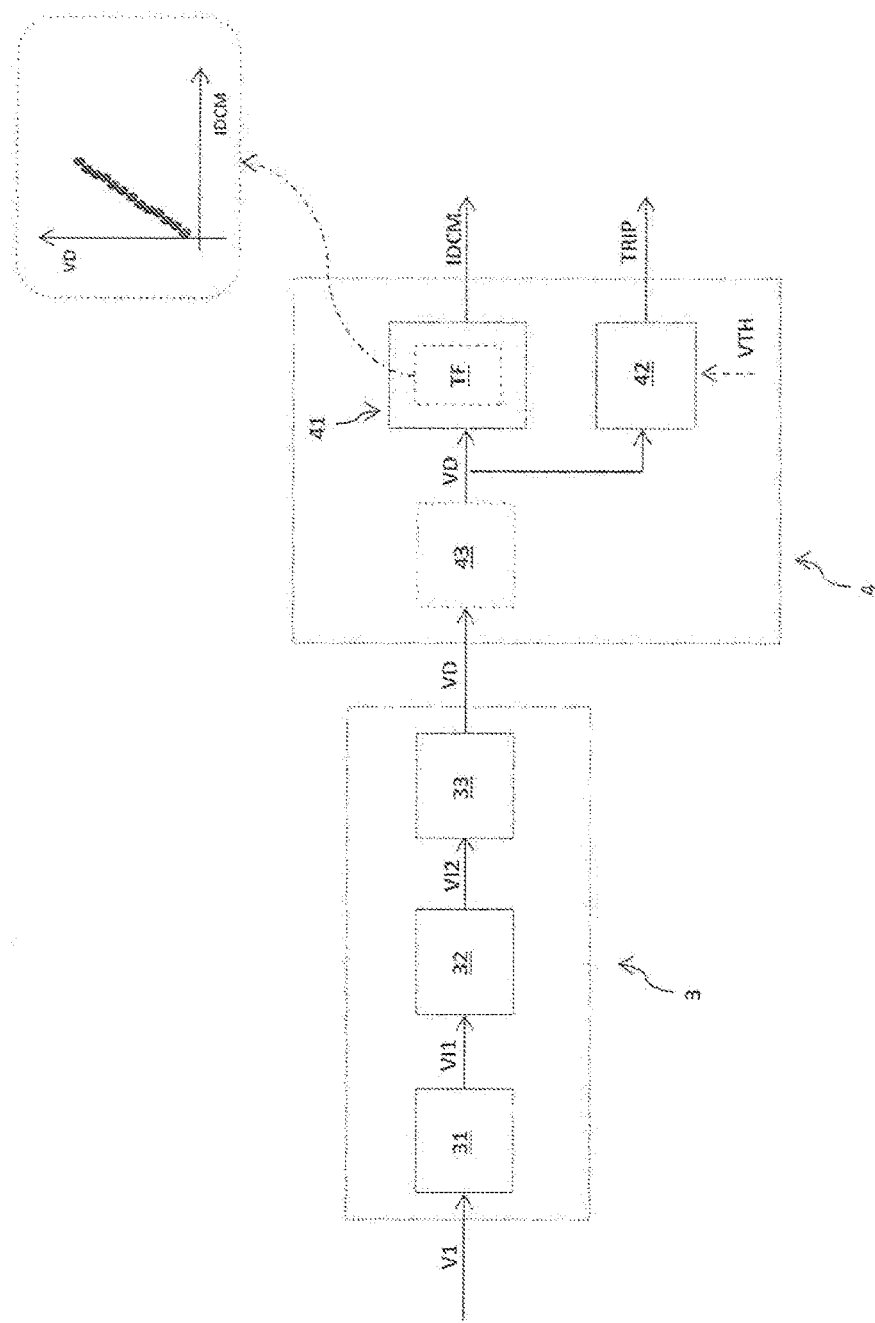
Figure 4:
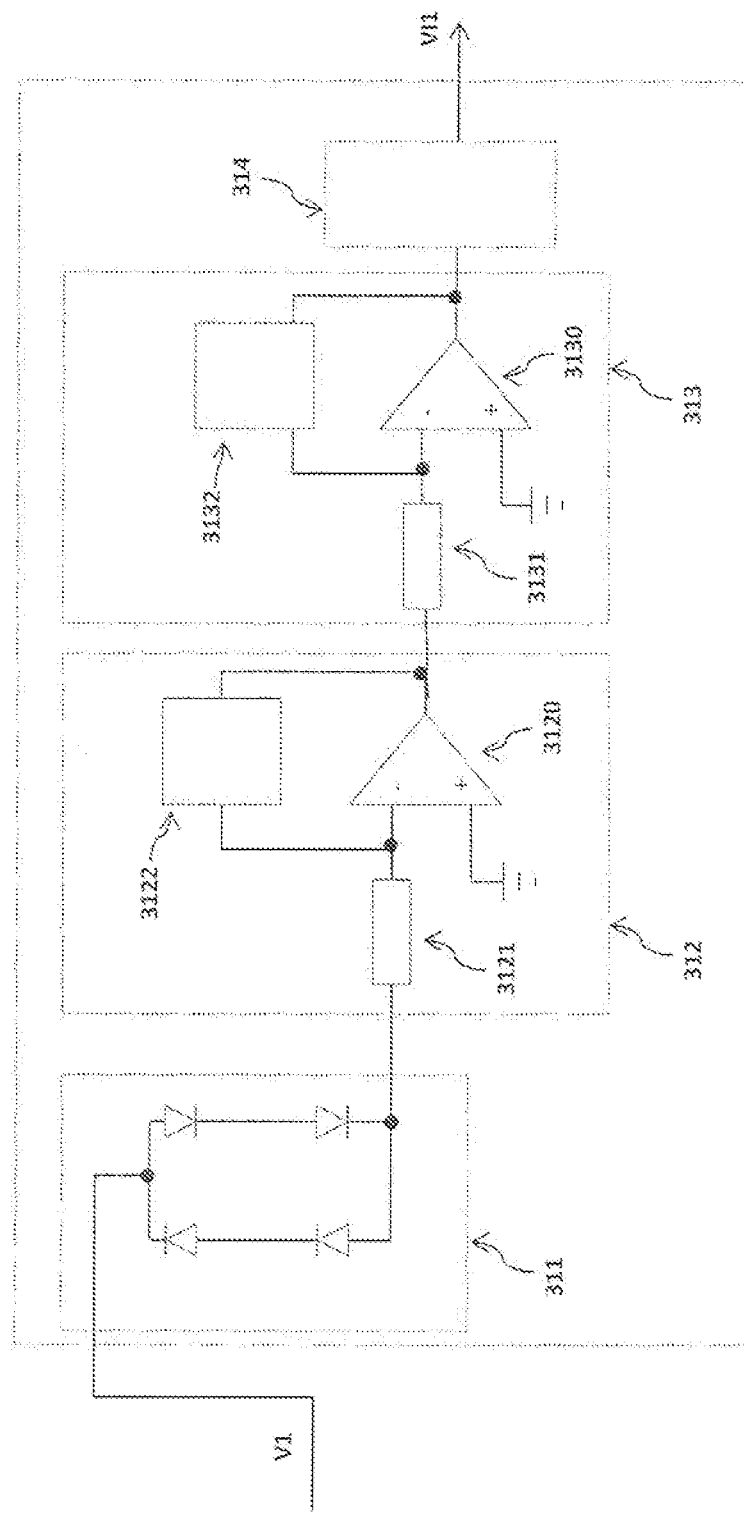

Referring to FIGS. 3-4, according to an aspect of the invention, the first signal processing block 3 preferably comprises a first signal processing module 31 configured to perform an amplitude filtering of the signal V1.

The signal processing module 31 provides in output a first intermediate signal VI1 (preferably a voltage signal), which is a function of the time-invariant and time-variant components of a differential current ID circulating among the conductors of the electric line 100.

The signal processing module 31 is advantageously configured to cut-off the fixed AC signal component FSC that is due to the circulation of the excitation current IE along the excitation winding 213.

Preferably, the first signal processing module 31 comprises a diode bridge circuit 311 and a cascade of amplifying circuits 312, 313 electrically connected to the diode bridge circuit 311. Preferably, the amplifying circuit 312 comprises an operation amplifier 3120 arranged in a known manner to provide amplification functionalities. As an example, the operational amplifier 3120 may be electrically connected to a resistive network 3121 and a resistive-capacitive network 3122.

Similarly, the amplifying circuit 313 may comprise an operation amplifier 3130 that may be arranged in a known manner to provide amplification functionalities. As an example, the operational amplifier 3130 may be electrically connected to a resistive network 3131 and a resistive-capacitive network 3132.

Other solutions are possible, in which a sole amplifying circuit is adopted in substitution of the amplifying circuits 312-313.

Preferably, the signal processing module 31 comprises an output filtering circuit 314 (e.g. of capacitive type in a known configuration) to filter undesired frequency components of the signal VI1.

Preferably, the diode bridge circuit 311, the amplifying circuit 312, the amplifying circuit 313 and the output filtering circuit 314 are electrically connected in series according to the configuration shown in FIG. 4.

Other circuit configurations are possible. As an example, the position of the diode bridge circuit 311 and of the amplifying circuits 312, 313 may be inverted.

Figure 5:
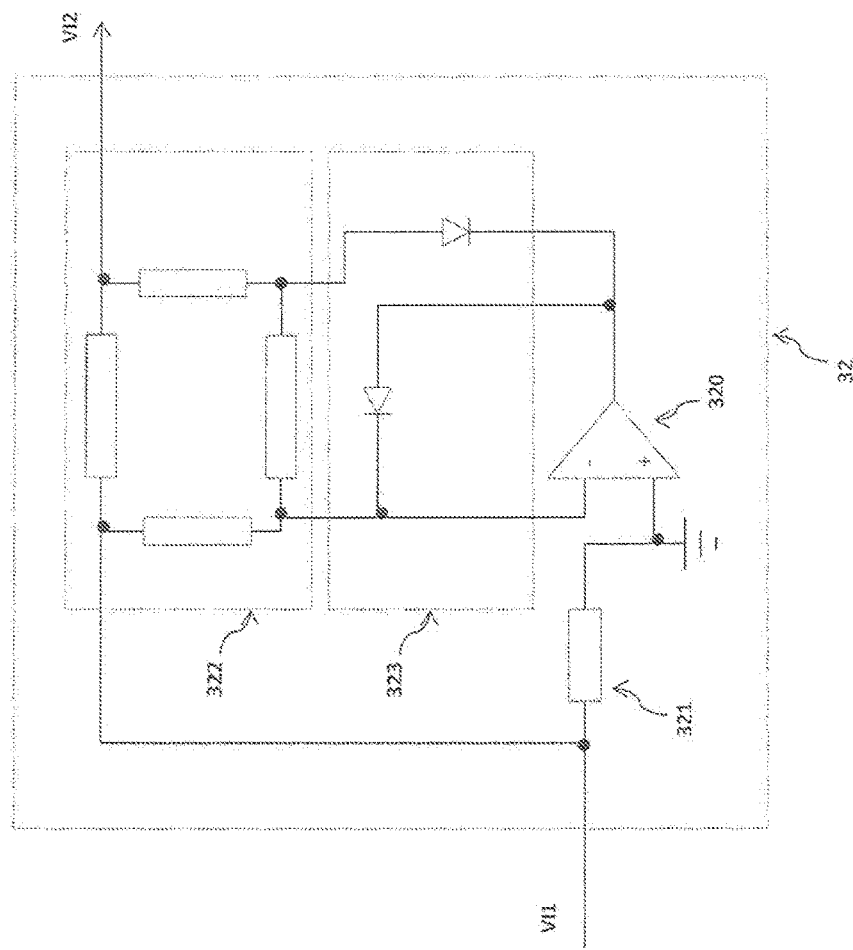
Figure 6:
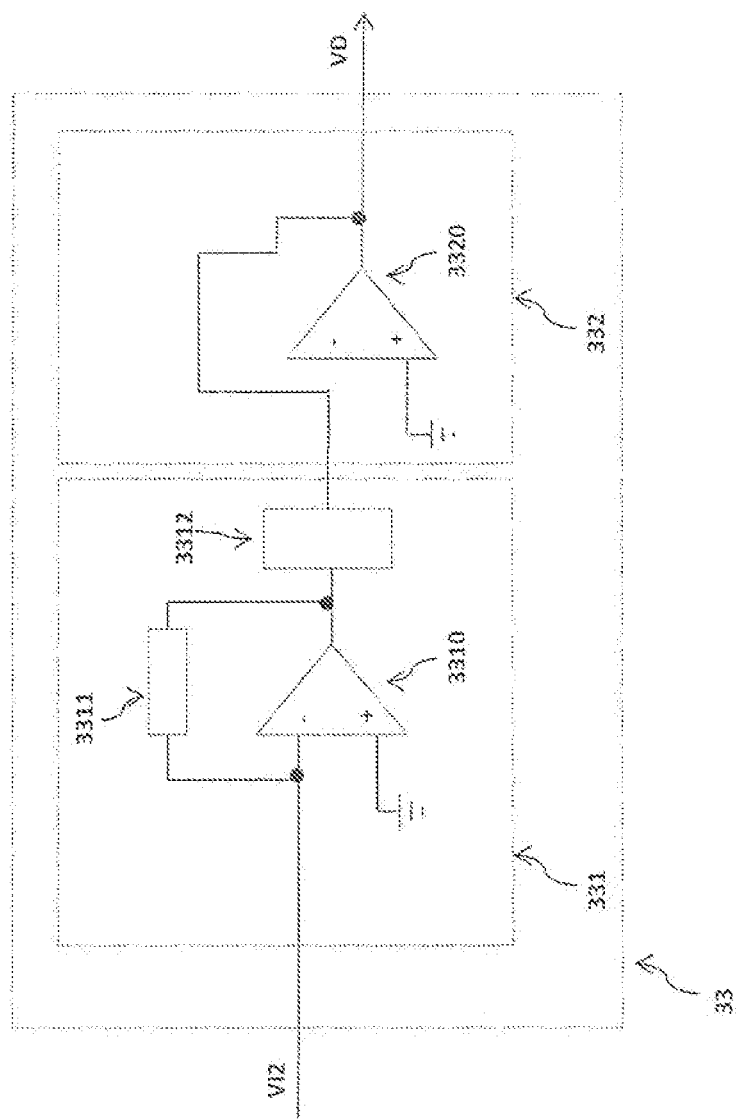

Referring to FIGS. 3 and 5-6, the first signal processing block 3 preferably comprises a second signal processing module 32 configured to perform a wave-form rectification of the signal VI1 provided in output by the signal processing module 31.

The signal processing module 32 provides a second intermediate signal VI2 (preferably a voltage signal), which is a rectified signal.

The second signal processing module 32 may comprise an operation amplifier 320 arranged in a known manner to provide rectification functionalities. As an example, the operational amplifier 320 may be suitably electrically connected to the resistive networks 321, 322 and the diode network 323. The resistive network 321 may be of known type whereas the resistive network 322 is preferably a bridge of resistors having suitable resistance values.

Preferably, the first signal processing block 3 comprises a third signal processing module 33 configured to perform a low-pass filtering of the signal VI2 provided in output by the second signal processing module 32. The signal processing module 33 provides in output the second signal VD.

Preferably, the signal processing module 33 comprises an integrator circuit 331 that is electrically connected to a voltage-follower circuit 332.

The integrator circuit 331 may comprise an operation amplifier 3310 arranged in a known manner to provide integration functionalities. As an example, the operational amplifier 3310 may be electrically connected to resistive-capacitive networks 3311 and 3312.

The voltage-follower circuit 332 may also comprise an operation amplifier 3320 arranged in a known manner to provide voltage-follower functionalities.

It is again evidenced that the signal processing block 3 (in particular the processing module 31) are configured to cut-off the AC signal component FSC due to the circulation of the excitation current IE.

The signals VI1, VI2 and VD therefore provide information on the absolute value of the differential current ID only. When no differential current ID is present among the conductors of the electric line 100, the signals VI1, VI2 and VD have amplitude substantially null (e.g. at 0.4V).

When a differential current ID is present, the signals VI1, VI2 and VD have an amplitude not null at the instants (FIGS. 12-15) in which the first signal V1 exceeds the amplitude of the fixed AC signal component FSC that is due to the presence of the excitation current IE (e.g. at the amplitude overshoots OS1, OS2).

The signal processing modules 31, 32, 33 are preferably implemented in an analog manner, as described above.

However, they may be also implemented in a digital manner. In this case, the signal processing module 31 may advantageously comprise a sampler (not shown), which is preferably arranged to perform a digital sampling and a smooth filtering of the signal V1 before further processing this latter.

Referring to FIG. 3, according to an aspect of the invention, the second signal processing block 4 preferably comprises a fourth processing module 41 configured to process the second signal VD by means a first transformation function TF.

The signal processing module 41 advantageously provides the first measurement signal IDCM.

The transformation function TF allows calculating the values of the measurement signal IDCM as a function of the values of the signal VD.

As example, the transformation function TF may be a look-up table that allows associating a single value of the measurement signal IDCM to a unique value of the signal VD.

The transformation function TF basically depends on the physical characteristics of the current transformer 21 and of the electronic implementation of the signal processing block 3. Advantageously, it may be experimentally set depending on the operating condition of the electronic device 1.

According to an aspect of the invention, the signal processing block 4 may comprise a fifth signal processing module 42 configured to compare the signal VD with a threshold value VTH (preferably a voltage value).

The signal processing module 42 provides a trip signal TRIP that depends on the behaviour of the signal VD.

As an example, the trip signal TRIP may be a logic signal that is set at a tripping command level (e.g. a high level of 3.3V), when the signal VD exceeds the threshold value or signal VTH.

The threshold value VTH may be set according to the application, in which the electronic device 1 is adopted.

As an example, when the electronic device 1 is used in a battery charger for electric vehicles, the threshold value VTH may be 2V.

The signal processing block 4 is preferably implemented in a digital manner.

In this case, when the signal processing block 3 is implemented in an analog manner, the second signal processing block 4 preferably comprises also a sampler 43, which is preferably arranged to perform a digital sampling and a smooth filtering of the signal VD before further processing this latter.

Figure 7:
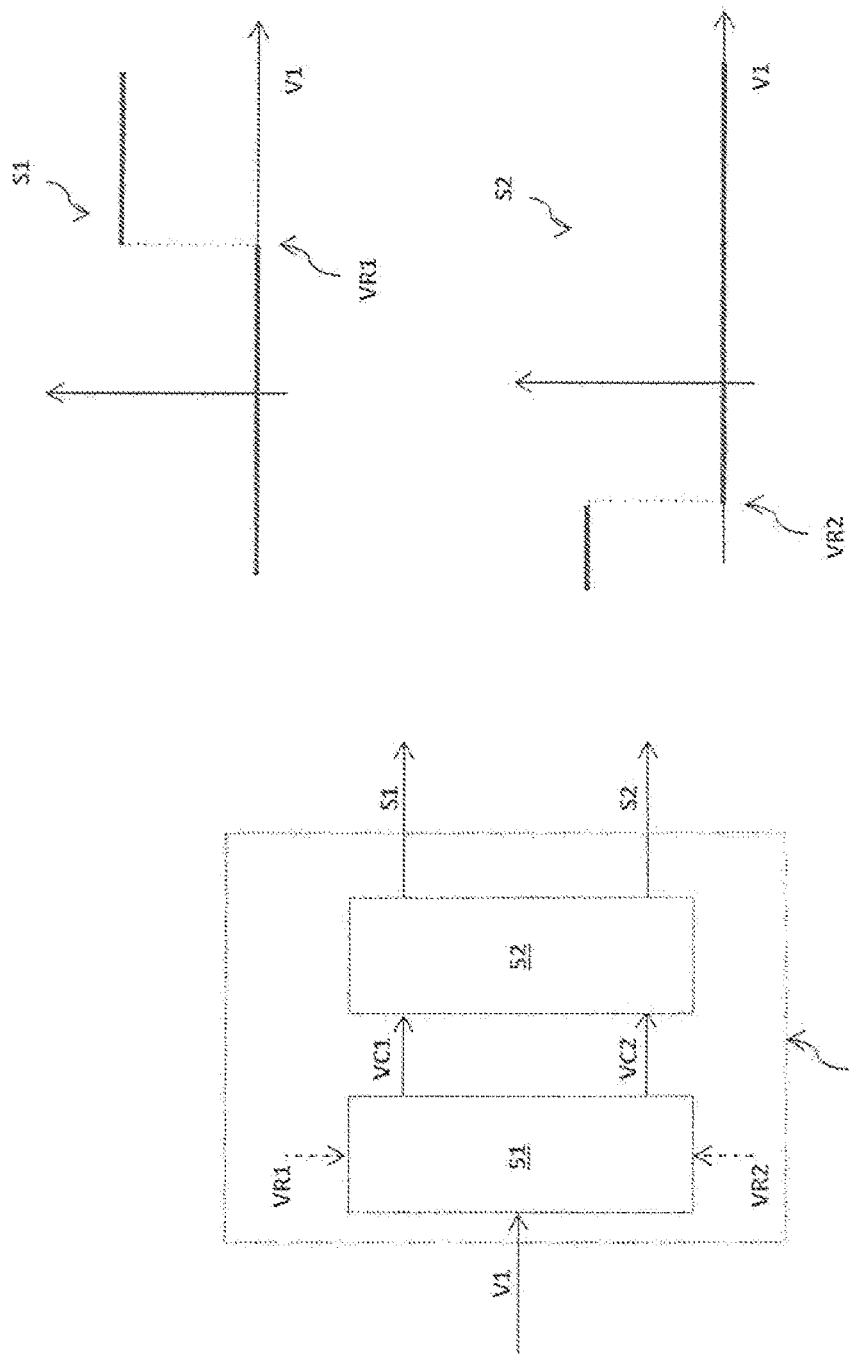
Figure 8:
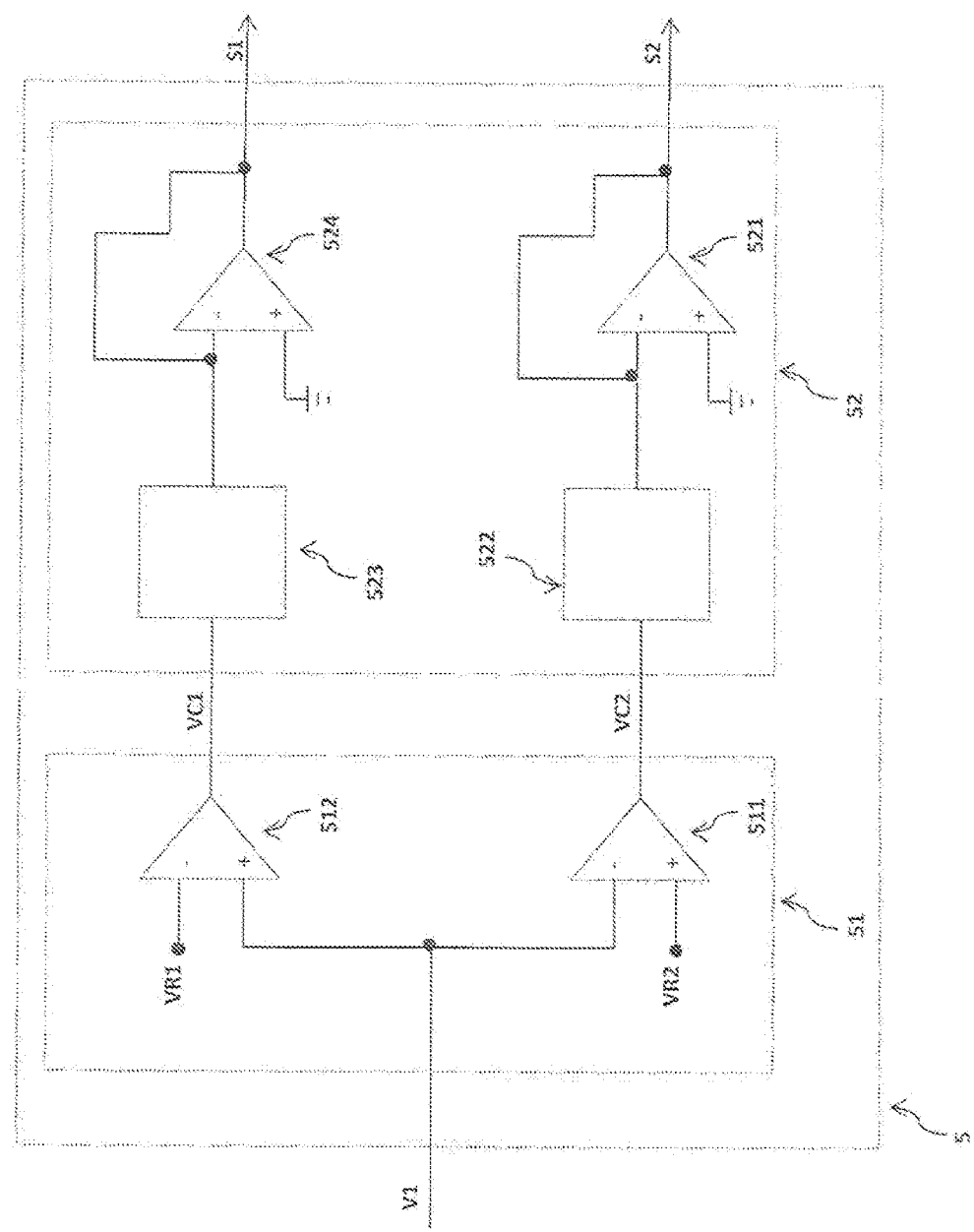

Referring to FIGS. 7-8, according to an aspect of the invention, the third signal processing block 5 preferably comprises a sixth signal processing module 51 configured to compare the first signal V1 with a first reference signal VR1 and with a second reference signal VR2 having opposite sign. As an example, the reference signals VR1, VR2 are reference voltages that may be positive and negative, respectively.

The signal processing module 51 provides a first comparison signal VC1 (preferably a voltage signal) and a second comparison signal VC2 (preferably a voltage signal).

The signal processing module 51 preferably comprises operation amplifiers 511, 512 that may be arranged in a known manner to provide comparison functionalities between the voltage V1 and the reference voltages VR1, VR2.

The signal processing block 5 preferably comprises a seventh signal processing module 52 configured to perform a low-pass filtering of the comparison signals VC1, VC2.

The signal processing module 52 provides the third and fourth signals S1, S2.

The signal processing module 52 may comprise filtering circuits 522, 523 electrically connected with operational amplifiers 521, 524 arranged in a known manner to provide voltage-follower functionalities.

Preferably, the signals S1, S2 are two-level signals that are functions of the signal V1.

Preferably, the signals S1, S2 have the behaviour shown in FIG. 7.

The signal S1 is at a high level (e.g. 3.3V) when the signal V1 is higher than a positive threshold value (the reference value VR1) whereas it is at a low level (e.g. 0V) when the signal V1 is lower than the reference value VR1.

The signal S2 is at a high level when the signal V1 is lower than a negative threshold value (the reference value VR2) whereas it is at a low level when the signal V1 is higher than the reference voltage VR2.

The reference voltages VR1, VR2 may be set according to the application in which the electronic device is adopted. As an example, when the electronic device 1 is used in a charging system for electric vehicles the reference voltages VR1, VR2 may be set at 1V and −1V, respectively.

The signal processing modules 51, 52 are preferably implemented in analog manner, as described above.

However, they may be easily implemented in a digital manner, too. In this case, the signal processing module 51 may advantageously comprise a sampler (not shown), which is preferably arranged to perform a digital sampling and a smooth filtering of the signal V1 before further processing this latter.

Figure 9:
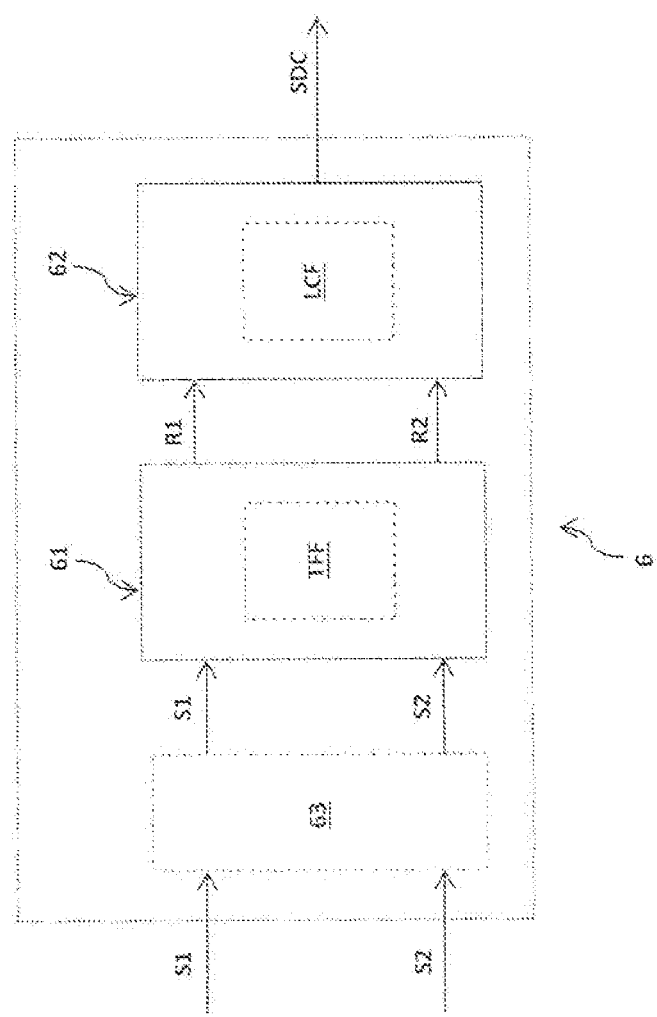
Figure 10:
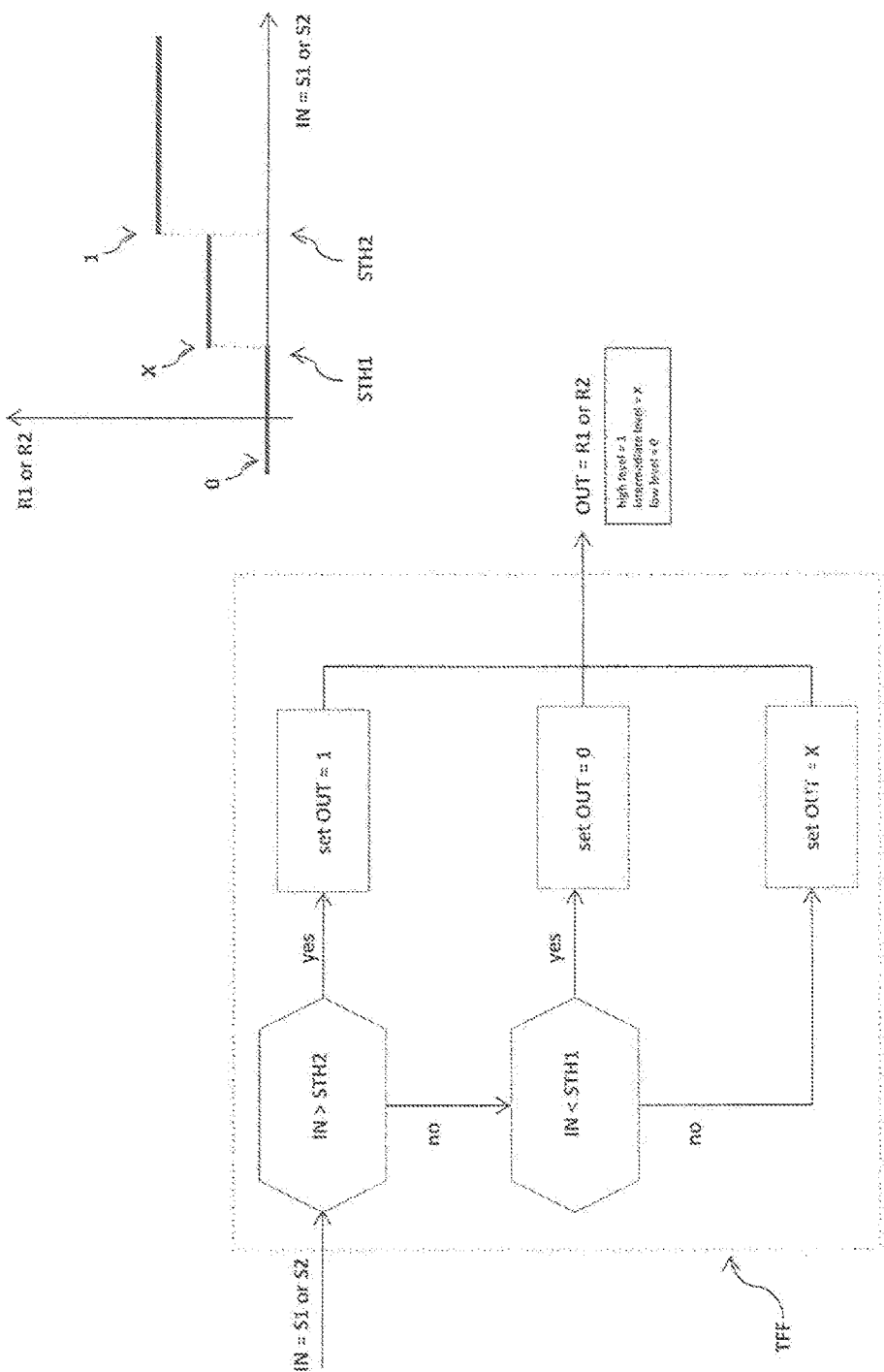

Referring to FIGS. 9-11, according to an aspect of the invention, the fourth signal processing block 6 preferably comprises an eighth signal processing module 61 configured to process the signals S1, S2 according to at least one threshold filtering function TFF.

The signal processing module 61 provides fifth and sixth signals R1, R2 (preferably voltage signals) indicative of the intensity of the signals S1, S2.

Preferably, the threshold filtering function TFF provides three-level signals R1, R2 that are functions of the signals S1, S2, respectively.

Preferably, the signals R1, R2 have the behaviour shown in FIG. 10.

From a data processing point of view, the signal processing module 61 may be configured to set the level of the signals R1, R2 according to the flowchart of FIG. 10, which is a possible implementation of the threshold filtering function TFF.

The signal processing module 61 compares each signals S1, S2 with a lower threshold value STH1 (preferably a voltage value) and a higher threshold value STH2 (preferably a voltage value), which advantageously are both positive. Based on the result of said comparison, the signal processing module 61 provides a corresponding signal R1, R2 at a given level.

For each signal R1, R2, the signal processing module 61 selects a voltage level that is indicative of the intensity (low, moderate, high) of the corresponding signal S1, S2. This latter is, in turn, indicative of the non-linear effects produced on the magnetic core 211 of the transformer 21 by the time-invariant component of the differential current ID.

If the signal S1, S2 is lower than the lower threshold value STH1, the signal processing module 61 provides a corresponding signal R1, R2 at a low level (e.g. 0V).

If the signal S1, S2 is comprised between the threshold values STH1 and STH2, the signal processing module 61 provides a corresponding signal R1, R2 at an intermediate level (e.g. 2.5V).

If the signal S1, S2 is higher than the higher threshold value STH2, the signal processing module 61 provides a corresponding signal R1, R2 at a high level (e.g. 3.3V).

The threshold values STH1, STH2 may be set according to the application in which the electronic device is adopted. As an example, when the electronic device 1 is used in a charging system for electric vehicles the threshold values STH1, STH2 may be set at 1.1V and 2.2V, respectively.

The signal processing block 6 preferably comprises a ninth signal processing module 62 configured to process the signals R1, R2 according to at least a logic combination function LCF.

The signal processing module 62 provides the second measurement signal SDC.

Preferably, the measurement signal SDC may have three voltage levels, similarly to the signals R1, R2.

The voltage level of the measurement signal SDC is set depending on the levels of the signals R1, R2.

Preferably, the logic combination function LCF sets the voltage level of the measurement signal SDC according to the following look-up table (implemented by the exemplary flowchart of FIG. 11):

| Voltage level of the signal R1 | Voltage level of the signal R2 | Voltage level of the signal SDC |
| --- | --- | --- |
| low | low | intermediate |
| high | low | high |

-continued

| Voltage level of the signal R1 | Voltage level of the signal R2 | Voltage level of the signal SDC |
|---|---|---|
| intermediate | low | high |
| low | high | low |
| high | high | intermediate |
| intermediate | high | low |
| low | intermediate | low |
| high | intermediate | high |
| intermediate | intermediate | intermediate |

If the voltage level of the measurement signal SDC is set at a high level (e.g. 3.3V), it means that the time-invariant component of the differential current ID flows according to a first direction that may correspond to positive sign according to a given sign convention.

If the voltage level of the measurement signal SDC is set at a low level (e.g. −3.3V), it means that the time-invariant component of the differential current ID flows according to a second direction that is opposite to the first direction and that may correspond to negative sign according to the said given sign convention.

If the voltage level of the measurement signal SDC is set at an intermediate level (e.g. 0V), it means that the direction of the time-invariant component of the differential current ID cannot be determined (e.g. due to the fact that the time-invariant component of the differential current ID is null).

From a physical point of view, the adoption of the look-up table shown above is justified by the following facts:
- if the time-invariant component of the differential current ID is positive (or negative) according to a given sign convention, it induces a non-linear behaviour of the magnetic core 211 of the transformer 21 that is of the same sign. Such a non-linear effect may be moderate or high;
- if the time-invariant component of the differential current ID is null or negligible, it induces a non-linear behaviour of the magnetic core 211 of the transformer 21 that is low or moderate.

From a data processing point of view, the signal processing module 62 may be configured to set the voltage level of the measurement signal SDC according to the flowchart of FIG. 11, which is a possible implementation of the look-up table shown above.

The signal processing block 6 is preferably implemented in a digital manner.

In this case, when the signal processing block 5 is implemented in an analog manner, the second signal processing block 6 preferably comprises a sampler 63, which is preferably arranged to perform a digital sampling and a smooth filtering of the signals S1, S2 before further processing these latter.

Referring now to FIG. 12, which refers to the embodiment shown in FIG. 1, the sixth signal processing block 7 may be of known type.

As an example, circuit configurations used in traditional ELCDs of the B-type may be adopted.

Preferably, the signal processing block 7 is implemented in analog manner, as described above.

However, they may be easily implemented in a digital manner, too. In this case, they may advantageously comprise a sampler (not shown), which is preferably arranged to perform a digital sampling and a smooth filtering of the signal V1 before further processing this latter.

Preferably, the seventh signal processing block 8 comprises a tenth processing module 81 configured to process the fifth signal VD2 by means a second transformation function TF2.

The signal processing module 81 advantageously provides the third measurement signal IDM. The transformation function TF2 allows calculating the values of the measurement signal IDM as a function of the values of the signal VD2.

As example, the transformation function TF2 may be a look-up table that allows associating a single value of the measurement signal IDM to a unique value of the signal VD2.

The transformation function TF2 basically depends on the physical characteristics of the current transformer 21 and of the electronic implementation of the signal processing block 7.

Advantageously, it may be experimentally set depending on the operating condition of the electronic device 1.

The signal processing block 8 is preferably implemented in a digital manner.

When the signal processing block 7 is implemented in an analog manner, the second signal processing block 8 preferably comprises also a sampler 83, which is preferably arranged to perform a digital sampling and a smooth filtering of the signal VD2 before further processing this latter.

Figure 13:
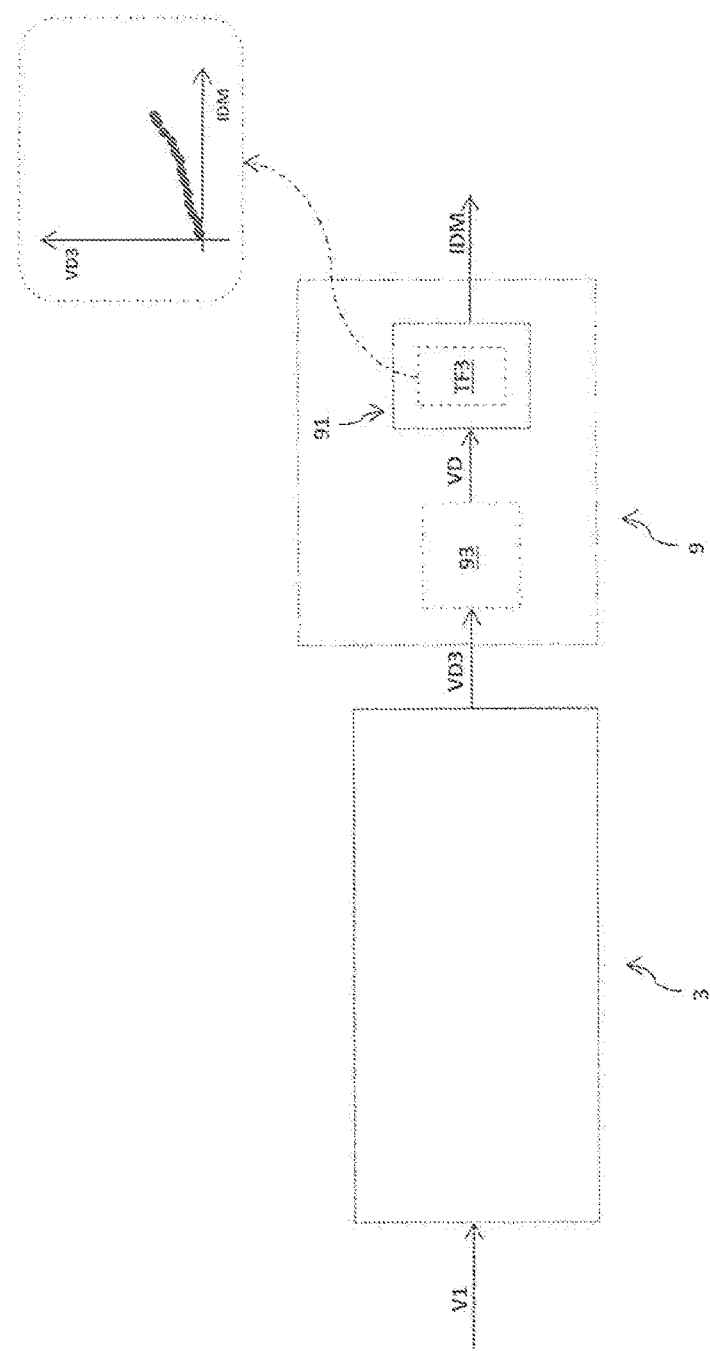

Referring now to FIG. 13, which refers to the embodiment shown in FIG. 1A, the eighth signal processing block 9 may comprise an eleventh processing module 91 configured to process the third signal VD3 by means a third transformation function TF3.

The signal processing module 91 advantageously provides the third measurement signal IDM.

The transformation function TF3 allows calculating the values of the measurement signal IDM as a function of the values of the signal VD3.

As example, the transformation function TF3 may be a look-up table that allows associating a single value of the measurement signal IDM to a unique value of the signal VD3.

The transformation function TF3 basically depends on the physical characteristics of the current transformer 21 and of the electronic implementation of the signal processing block 3.

Advantageously, it may be experimentally set depending on the operating condition of the electronic device 1.

The signal processing block 9 is preferably implemented in a digital manner.

When the signal processing block 3 is implemented in an analog manner, the second signal processing block 9 preferably comprises also a sampler 93, which is preferably arranged to perform a digital sampling and a smooth filtering of the signal VD3 before further processing this latter.

As mentioned above, the electronic device 1 preferably comprises fifth signal processing block 10 capable of providing the measurement signals IDC and possibly IAC and/or IDT.

Preferably, the signal processing block 10 is implemented in a digital manner.

In FIG. 18, it is shown an example of implementation of the electronic device 1, according to the invention, in an electronic arrangement 900 for LV or MV applications.

The electronic device 1 is shown in the embodiment of FIG. 1. However, also the embodiments shown in FIGS. 1A, 1B may be adopted.

The electronic arrangement 900 may be, for example, a battery charger for electric vehicles, a protection device or an IED (Intelligent Electronic Device) for LV or MV electric power distribution networks.

The measurement signals IDC and IAC and the trip signal TRIP provided by the electronic device 1 are acquired by a control unit 902 of the electronic arrangement 900.

The control unit 902 may be advantageously configured to route the trip signal TRIP to activate a tripping unit 901 that is capable to interrupt the electric line 100.

This solution is particularly useful in battery chargers and in protection devices for LV or MV electric power distribution networks.

The control unit 902 may be advantageously configured to process the signals IDC, IAC to provide control signals C to implement advanced fault management functionalities.

As an example, in a battery charger, the control unit 902 may be configured to process the signals IDC, IAC and generate suitable control signals C for a DC compensator (not shown), which may be advantageously provided with a compensator the time-invariant component of a detected differential current ID.

Said compensator may, for example, be configured to inject in the electric line 100 a smooth DC current having an opposite sign of said time-invariant component, so as to mitigate or remove the overall DC leakage.

Those skilled in the art may easily understand that the electronic device 1 of the invention may be easily configured for applications different from the one shown in FIG. 18.

The electronic device 1 of the invention may also be configured for applications having different scale and current ratings from those mentioned above.

The electronic device 1 of the invention has a number of advantages.

The electronic device 1 is capable of detecting a differential current ID in an electric line 100 and providing quantitative information (including information regarding the sign) about the time-invariant and time-variant components of said differential current, which may be conveniently exploited according to the needs.

The electronic device 1 is capable of providing accurate measurements of the time-invariant and time-variant components of a detected differential current. In fact, the electronic device 1 basically shows a substantially linear response (the measurement signals ICDM, IDM) to the measured quantity (the differential current ID) as it is possible to notice in graphs of FIGS. 3, 12, 13.

Information on the time-invariant component of a differential current may be conveniently exploited to arrange a compensator capable of injecting in the electric line 100 an opposite time-invariant differential current.

Such a compensation arrangement may ensure a longer operational service time of the electric line 100 or of the electrical systems/apparatuses connected thereto.

As an example, a protection device arranged to trip the electric line 100, which incorporates the electronic device 1 and the mentioned compensator, may be capable of remaining in a closed state for a longer time, thereby ensuring a prolonged service of the electric line without jeopardizing safety.

Information on the time-invariant component of a differential current may be conveniently exploited to improve functionalities of electrical apparatuses dedicated to LV or MV electric power distribution networks, such as protection devices, switching apparatuses, relays or the like.

As an example, an ELCD (Earth Leakage Current Device) of the B-type incorporating the electronic device 1 can provide improved diagnostics functionalities, which may be suitably exploited to manage the operation of said protection device or for implementing advanced smart-grid management functionalities. In this last case, information provided by the electronic device 1 may be easily communicated directly or through a proper communication network to any device of the electric power distribution network or of the control system in which the ELCD is installed.

Information on the time-invariant component of a differential current may be conveniently exploited to verify, mitigate or correct maximal DC injection rates in an electric power distribution network by an electrical system, as prescribed by relevant standards for electric systems, including distributed resource interconnections with electric power systems and photovoltaic systems.

The electronic device 1 can be easily embedded or integrated in many different LV or MV applications.

For instance, the electronic device 1 can be easily used in:
- on-board battery chargers, off-board charging equipment, in-cable portable charging equipment, vehicle power supply equipment for vehicles; and/or
- residual current devices, tripping devices, protection devices, switching apparatuses, relays and control devices for electric power distribution networks; and/or
- IEDs, i.e. electronic microcontroller-based devices for managing operation of electric power equipment for electric power distribution networks;
- photovoltaic electric power generation systems.

The adoption of the electronic device 1 in some applications may help to reduce overall installation costs of these latter.

As an example, the installation on off-board charging equipment for vehicles in a domestic environment normally requires the substitution of the ECLDs of the domestic electric power distribution network.

These latter devices, in fact, are traditionally of A and AC type and are subject to malfunctioning in presence of possible differential currents having non-negligible time-invariant components during the battery charging process.

By adopting the electronic device 1, it is possible to perform precise measurements of the time-invariant component of possible differential currents and check whether said time-invariant component exceeds a given threshold value (e.g. 6 mA).

Such information may be used by a control unit of the charging equipment to interrupt the charging process when differential currents having non-negligible time-invariant components are present.

Protection functionalities of the ECLDs of the domestic electric power distribution network are thus ensured without the need of expensive substitution interventions.

The electronic device 1 may comprise autonomous processing resources (e.g. it may be provided with an own microcontroller) or it may share processing resources that are present in the device, apparatus or system, in which it is embedded or integrated.

As an example, referring to FIG. 18, the electronic device 1 may use a microcontroller (not shown) of the control unit 902 to execute software instructions for digitally implementing the functions of the processing blocks 4, 6, 8, 9, 10 described above.

The electronic device 1 may also be used as stand-alone device and it can be easily put into communication with a remote device. In this case, the electronic device 1 is preferably provided with autonomous processing resources (e.g. a microcontroller).

The electronic device 1 is easy and cheap to implement and/or manufacture at industrial level.

The invention claimed is:

1. An electronic device for measuring a differential current in an electric line having a plurality of conductors, said electronic device comprising:
   a sensing circuit comprising:
      a current transformer having a magnetic core operatively coupled to the conductors of said electric line, a secondary winding and an excitation winding along which an excitation current circulates to polarize said magnetic core;
      an output circuit section electrically connected to said secondary winding and configured to provide a first signal indicative of said differential current;
   which comprises:
   a first signal processing block configured to process said first signal and provide a second signal indicative of said differential current;
   a second signal processing block configured to process said second signal and provide a first measurement signal indicative of the absolute value of a time-invariant component of said differential current;
   a third signal processing block configured to process said first signal and provide third and fourth signals indicative of whether said magnetic core operates in a positive or in a negative saturation region of the hysteresis loop of said magnetic core;
   a fourth signal processing block configured to process said third and fourth signals and provide a second measurement signal indicative of the direction of the time-invariant component of said differential current.

2. An electronic device, according to claim 1, which comprises a fifth signal processing block configured to process said first and second measurement signals and provide a fourth measurement signals indicative of the time-invariant component of said differential current.

3. An electronic device, according to claim 2, which comprises:
   a sixth signal processing block configured to process said first signal and provide a fifth signal indicative of said differential current;
   a seventh signal processing block configured to process said fifth signal and provide a third measurement signal indicative of the absolute value of said differential current.

4. An electronic device, according to claim 1, wherein said first signal processing block is configured to provide a sixth signal indicative of said differential current, said electronic device comprising an eighth signal processing block configured to process said sixth signal and provide a third measurement signal indicative of the absolute value of said differential current.

5. An electronic device, according to claim 3, wherein said fifth signal processing block is also configured to process said first and third measurement signals (IDCM, IDM) and provide a fifth measurement signal indicative of the time-variant components of said differential current.

6. An electronic device, according to claim 5, wherein said fifth signal processing block is also configured to process said first, second and third measurement signals and provide a sixth measurement signal indicative of said differential current.

7. An electronic device, according to claim 2, wherein said fifth signal processing block is also configured to process said first and second measurement signals and said first signal and provide a fifth measurement signal indicative of the time-variant components of said differential current and/or sixth measurement signal indicative of said differential current.

8. An electronic device, according to claim 1, wherein said first signal processing block comprises:
   a first signal processing module configured to perform an amplification and an amplitude filtering of said first signal, said first signal processing module providing a first intermediate signal that is indicative of said differential current;
   a second signal processing module configured to perform a wave-form rectification of said first intermediate signal, said second signal processing module providing a second intermediate signal;
   a third signal processing module configured to perform a low-pass filtering of said second intermediate signal, said third signal processing module providing said second signal.

9. An electronic device, according to claim 1, wherein said second signal processing block comprises a fourth processing module configured to process said second signal by means a first transformation function, said fourth signal processing module providing said first measurement signal.

10. An electronic device, according to claim 1, wherein said second signal processing block comprises a fifth signal processing module configured to compare said second signal with a threshold value and provide a trip signal depending on the behaviour of said second signal.

11. An electronic device, according to claim 1, wherein said third signal processing block comprises:
    a sixth signal processing module configured to compare said first signal with a first reference voltage and with a second reference voltage, said sixth signal processing module providing a first comparison signal and a second comparison signal;
    a seventh signal processing module configured to perform a low-pass filtering of said first comparison signal and of said second comparison signal, said seventh signal processing module providing said third signal and said fourth signal.

12. An electronic device, according to claim 1, wherein said fourth signal processing block comprises:
    an eighth signal processing module configured to process said third and fourth signals according to at least one threshold filtering function, said eighth signal processing module providing fifth and sixth signals indicative of the intensity of said third and fourth signals;
    a ninth signal processing module configured to process said fifth and sixth signals according to at least a logic combination function, said ninth signal processing module providing said second measurement signal.

13. An electronic arrangement for LV or MV applications which comprises an electronic device, according to claim 1.

14. An electronic arrangement, according to claim 13, which is:
    a battery charger for electric vehicles or a vehicle power supply equipment; or
    a protection device or a switching apparatus for electric power distribution systems or networks; or
    an IED for electric power distribution systems or networks.

15. A photovoltaic electric power generation system wherein it comprises an electronic device, according to claim 1.

16. An electric power distribution system or network it comprises an electronic device, according to claim 1.

17. An electronic device, according to claim 1, which comprises:
- a sixth signal processing block configured to process said first signal and provide a fifth signal indicative of said differential current;
- a seventh signal processing block configured to process said fifth signal and provide a third measurement signal indicative of the absolute value of said differential current.

18. An electronic device, according to claim 2, wherein said first signal processing block is configured to provide a sixth signal indicative of said differential current, said electronic device comprising an eighth signal processing block configured to process said sixth signal and provide a third measurement signal indicative of the absolute value of said differential current.

19. An electronic device, according to claim 18, wherein said fifth signal processing block is also configured to process said first and third measurement signals and provide a fifth measurement signal indicative of the time-variant components of said differential current.

20. An electronic device, according to claim 18, wherein said fifth signal processing block is also configured to process said first, second and third measurement signals and provide a sixth measurement signal indicative of said differential current.

\* \* \* \* \*